(12) United States Patent
Lee

(10) Patent No.: US 9,972,397 B2
(45) Date of Patent: May 15, 2018

(54) SEMICONDUCTOR MEMORY DEVICE AND OPERATING METHOD THEREOF

(71) Applicant: SK hynix Inc., Gyeonggi-do (KR)

(72) Inventor: Hee Youl Lee, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/624,991

(22) Filed: Jun. 16, 2017

(65) Prior Publication Data

US 2017/0372786 A1 Dec. 28, 2017

(30) Foreign Application Priority Data

Jun. 24, 2016 (KR) .................. 10-2016-0079603
Sep. 26, 2016 (KR) .................. 10-2016-0123222

(51) Int. Cl.
*G11C 16/26* (2006.01)
*G11C 16/16* (2006.01)
*G06F 1/32* (2006.01)
*G11C 16/08* (2006.01)

(52) U.S. Cl.
CPC ............ *G11C 16/16* (2013.01); *G06F 1/3275* (2013.01); *G06F 1/3296* (2013.01); *G11C 16/08* (2013.01)

(58) Field of Classification Search
CPC .............................. G11C 16/10; G11C 16/26
USPC .......................... 365/185.11, 185.24
See application file for complete search history.

(56) References Cited

U.S. PATENT DOCUMENTS

| | | | | |
|---|---|---|---|---|
| 7,149,115 B2* | 12/2006 | Ogura | ................ | G11C 7/06 365/185.11 |
| 8,125,829 B2* | 2/2012 | Tanzawa | ............ | G11C 16/0483 365/185.11 |
| 9,378,839 B2* | 6/2016 | Goda | ................ | H01L 27/11519 |
| 9,620,217 B2* | 4/2017 | Lue | ................ | G11C 16/08 |
| 9,837,159 B2* | 12/2017 | Lee | ................ | G11C 16/14 |
| 9,837,160 B1* | 12/2017 | Oh | ................ | G11C 16/16 |
| 2006/0203550 A1* | 9/2006 | Lee | ................ | G11C 16/16 365/185.13 |
| 2008/0123424 A1* | 5/2008 | Umezawa | ................ | G11C 8/08 365/185.13 |
| 2009/0290420 A1* | 11/2009 | Park | ................ | G11C 16/3454 365/185.13 |
| 2011/0051524 A1* | 3/2011 | Hsu | ................ | G11C 11/5628 365/185.22 |

(Continued)

FOREIGN PATENT DOCUMENTS

KR 1020130035553 4/2013
KR 1020170052026 5/2017

*Primary Examiner* — Michael Tran
(74) *Attorney, Agent, or Firm* — IP & T Group LLP

(57) ABSTRACT

The present disclosure relate a method of operating a semiconductor memory device including at least two memory blocks sharing one block word line. The method including applying an erase voltage to a source line commonly coupled to the memory blocks, one of which is a selected memory block and applying a first voltage to the block word line and a third voltage to a global word line of an unselected memory block of the memory blocks when the erase voltage is applied to the source line, wherein the first voltage is higher than a turn-on voltage to turn on a pass transistor coupled to the block word line, and wherein the third voltage floats a local word line included in the unselected memory block according to a level of the first voltage.

20 Claims, 17 Drawing Sheets

(56) References Cited

U.S. PATENT DOCUMENTS

| | | | |
|---|---|---|---|
| 2011/0188281 A1* | 8/2011 | Siau .................... | G11C 5/02 |
| | | | 365/51 |
| 2013/0272067 A1* | 10/2013 | Lee ..................... | G11C 16/10 |
| | | | 365/185.11 |
| 2014/0010013 A1* | 1/2014 | Lu ...................... | G11C 16/16 |
| | | | 365/185.11 |
| 2014/0063892 A1* | 3/2014 | Yip ..................... | G11C 7/18 |
| | | | 365/72 |
| 2014/0192596 A1* | 7/2014 | Rhie ................... | G11C 11/5635 |
| | | | 365/185.17 |
| 2015/0279471 A1* | 10/2015 | Lee ..................... | G11C 16/14 |
| | | | 365/185.11 |
| 2016/0163390 A1* | 6/2016 | Park ................... | G11C 16/10 |
| | | | 365/185.11 |

* cited by examiner

FIG. 8
| SELECTED BLK | UNSELECTED BLK |
|---|---|
| 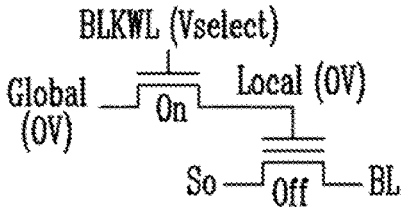 | 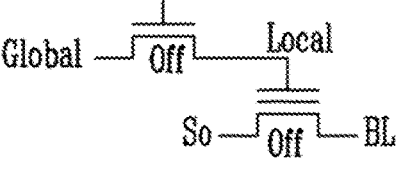 |
| SHARED BLK (Low Vt) | SHARED BLK (High Vt) |
| 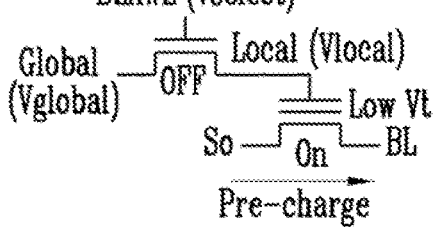 | 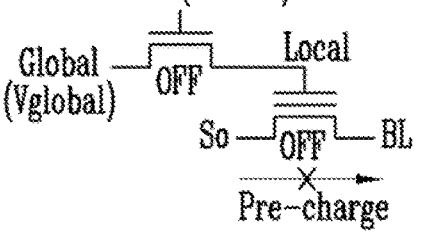 |

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2016-0079603, filed on Jun. 24, 2016 and Korean patent application number 10-2016-0123222, filed on Sep. 26, 2016, the entire disclosure of each of which is incorporated herein by reference in its entirety.

BACKGROUND

Field of Invention

Various embodiments of the invention relate generally to an electronic device, and more particularly, to a semiconductor memory device and an operating method thereof.

Description of Related Art

A memory system has been widely used as a data storage of a digital device, such as a computer, a digital camera, an MP3 player, and a smartphone. The memory system may include a semiconductor memory device storing data and a controller controlling the memory device. The digital device may operate as a host of the memory system and the controller may transfer commands and data between the host and the semiconductor memory device.

A semiconductor memory device is a memory device embodied by using semiconductors such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM) and Synchronous DRAM (SDRAM). Non-volatile memory devices retain stored data regardless of power on/off conditions. Examples of non-volatile memory include read only memory (ROM), mask ROM (MROM), programmable ROM (PROM), erasable Programmable ROM (EPROM), electrically erasable and programmable ROM (EEPROM), flash memory, phase-change random access memory (PRAM), magnetic RAM (MRAM), resistive RAM (RRAM) and ferroelectric RAM (FRAM). Flash memories are classified into NOR-type memories and NAND-type memories.

SUMMARY

Various embodiments are directed to a semiconductor memory device having an increased erase speed and an operating method thereof.

According to an embodiment, a method of operating a semiconductor memory device including at least two memory blocks sharing one block word line may include applying an erase voltage to a source line commonly coupled to the memory blocks, one of which is a selected memory block and applying a first voltage to the block word line and a third voltage to a global word line of an unselected memory block of the memory blocks when the erase voltage is applied to the source line, wherein the first voltage is higher than a turn-on voltage to turn on a pass transistor coupled to the block word line, and wherein the third voltage floats a local word line included in the unselected memory block according to a level of the first voltage.

According to an embodiment, a semiconductor memory device may include at least two memory blocks sharing one block word line, a peripheral circuit configured to perform an erase operation on a selected memory block of the memory blocks and a control circuit configured to control the peripheral circuit to apply a first voltage to the block word line and a third voltage to a global word line of an unselected memory block of the memory blocks when an erase voltage is applied to a source line commonly coupled to the memory blocks, wherein the first voltage is higher than a turn-on voltage to turn on a pass transistor coupled to the block word line, and wherein the third voltage floats a local word line included in the unselected memory block according to a level of the first voltage.

According to an embodiment, a semiconductor memory device may include an address decoder including a plurality of block decoders; and at least two memory blocks, one of which is a selected memory block, corresponding to one of the block decoders, wherein the address decoder applies a first voltage to a block word line, which is an output line of the block decoder, and a third voltage to a global word line of an unselected memory block of the memory blocks when an erase voltage is applied to a source line coupled commonly to the memory blocks, wherein the first voltage is higher than a turn-on voltage which turns on a pass transistor coupled to the block word line, and wherein the third voltage floats a local word line included in the unselected memory block according to a level of the first voltage.

According to an embodiment, a semiconductor memory device may include a memory cell array including at least two memory blocks sharing one block word line and a transfer block coupled to the memory blocks through bit lines, a peripheral circuit suitable for performing an erase operation on a selected memory block of the memory blocks and a control circuit suitable for controlling the peripheral circuit to apply a first positive voltage to the block word line and a block word line corresponding to the transfer block and a second positive voltage higher than the first positive voltage to a global word line of the unselected memory block of the memory blocks when an erase voltage is applied to a source line commonly coupled to the memory blocks, wherein the first positive voltage has a level to turn on pass transistors coupled to the block word line of the memory blocks and the block word line corresponding to the transfer block.

According to an embodiment, a semiconductor memory device may include a memory cell array including at least two memory blocks sharing one block word line, a transfer block coupled to the memory blocks through bit lines, a peripheral circuit suitable for performing an erase operation on a selected memory block of the memory blocks and a control circuit suitable for controlling the peripheral circuit to apply a first positive voltage to the block word line and a block word line corresponding to the transfer block, a second positive voltage higher than the first positive voltage to a global word line of an unselected memory block of the memory blocks, and a turn-on voltage to gate electrodes of switch transistors included in the transfer block to turn on the switch transistors when an erase voltage is applied to a source line commonly coupled to the memory blocks, wherein the first positive voltage has a level to turn on pass transistors coupled to the block word line of the memory blocks and the block word line corresponding to the transfer block.

BRIEF DESCRIPTION OF THE DRAWINGS

FIG. 8 is a diagram illustrating operations of memory blocks during an erase operation of a semiconductor memory device;

DETAILED DESCRIPTION

Figure 1:
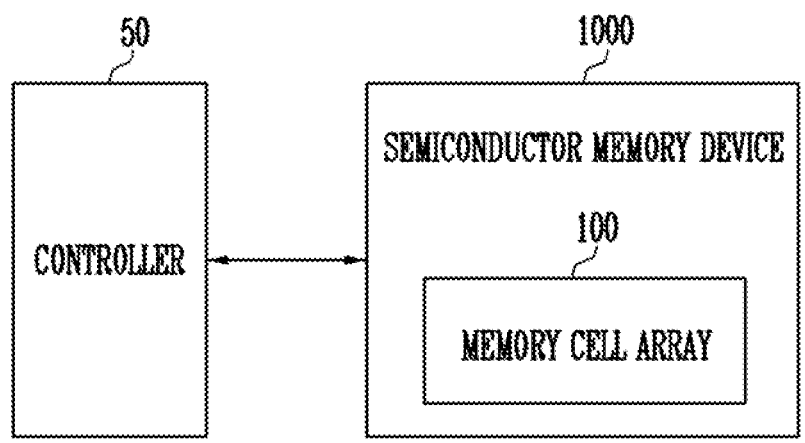
FIG. 1 is a block diagram illustrating the configuration of a memory system.

Hereinafter, specific structural or functional descriptions of examples of embodiments in accordance with concepts which are disclosed in this specification are illustrated only to describe the examples of embodiments in accordance with the concepts and the examples of embodiments in accordance with the concepts may be carried out by various forms but the descriptions are not limited to the examples of embodiments described in this specification.

Various modifications and changes may be applied to the examples of embodiments in accordance with the concepts so that the examples of embodiments will be Illustrated in the drawings and described in the specification. However, the examples of embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from the other component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe the relationship between components, that is, "between" and "directly between", or "adjacent to" and "directly adjacent to" need to be interpreted by the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if they are not clearly defined in this specification.

In some embodiments, well-known processes, device structures, and technologies will not be described in detail to avoid ambiguousness of the present invention.

Hereinafter, the present disclosure will be described by describing examples of embodiments with reference to the accompanying drawings.

FIG. 1 is a block diagram illustrating the configuration of a memory system.

A memory system may include a semiconductor memory device 1000 and a controller 50.

The semiconductor memory device 1000 may be a NAND flash memory, a vertical NAND flash memory, a NOR flash memory, a resistive random access memory (RAM) (RRAM), a phase-change memory (PRAM), a magnetoresistive random access memory (MRAM), a ferroelectric random access memory (FRAM), or a spin transfer torque random access memory (STT-RAM). In addition, according to an embodiment, the semiconductor memory device 1000 of the memory system may have a three-dimensional array structure. The invention may be applicable to a flash memory device having a charge storing layer including a floating gate (FG) flash memory, or a charge trap flash (CTF) flash memory having a charge storing layer including an insulating layer.

The semiconductor memory device 1000 may include a memory cell array 100. The memory cell array 100 may include a plurality of non-volatile memory cells.

The semiconductor memory device 1000 may receive commands and addresses from the controller 50 and access a region of the memory cell array which is selected by an address. That is, the semiconductor memory device 1000 may perform an internal operation corresponding to a command on the region selected by the address.

For example, the semiconductor memory device 1000 may perform a program operation, a read operation and an erase operation. During the program operation, the semiconductor memory device 1000 may program the region selected by the address with data. During the read operation, the semiconductor memory device 1000 may read data from the region selected by the address. During the erase operation, the semiconductor memory device 1000 may erase the data stored in the portion selected by the address.

According to an embodiment, the read and program operations of the semiconductor memory device 1000 may be performed in units of pages. The erase operation of the semiconductor memory device 1000 may be performed in units of memory blocks.

Figure 2:
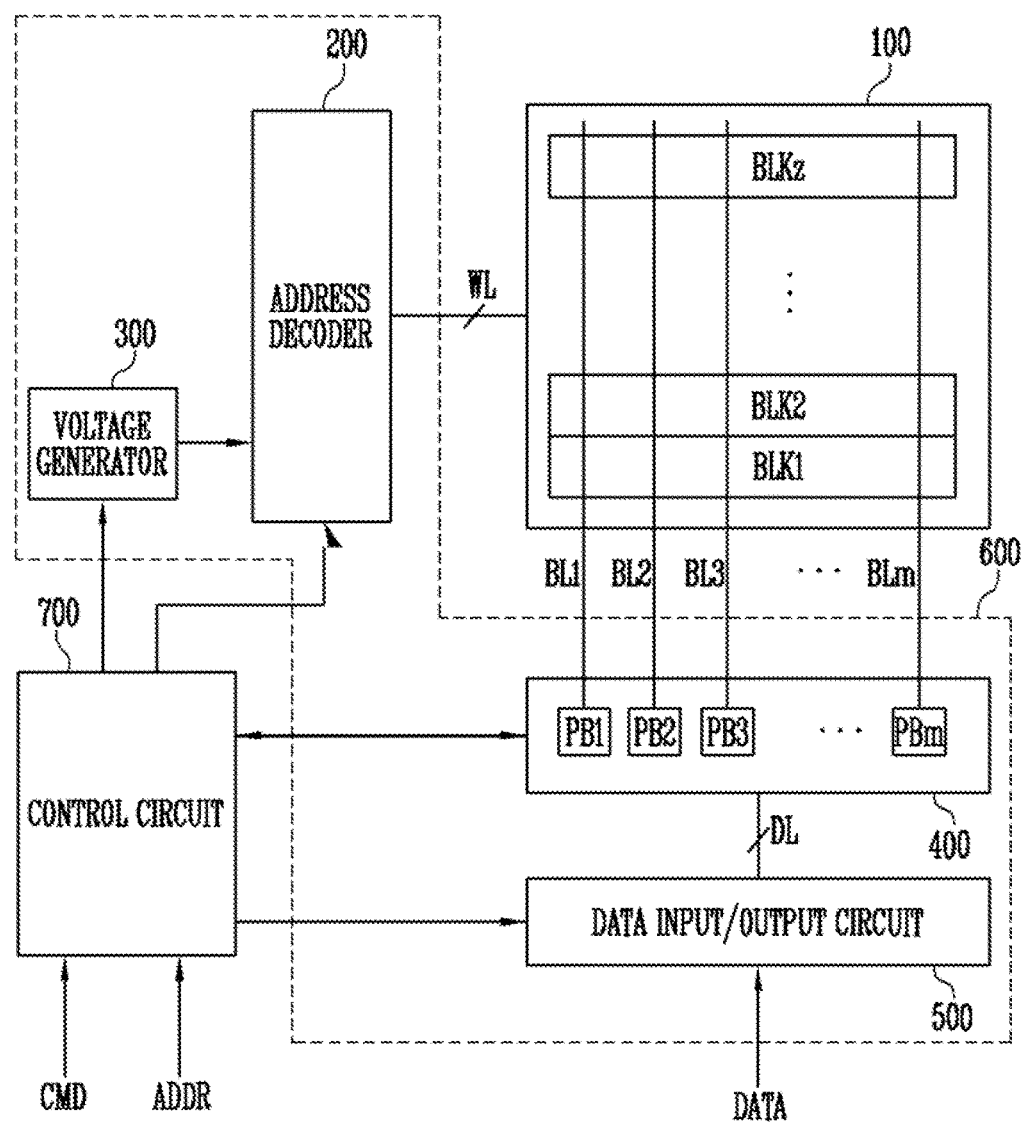
FIG. 2 is a block diagram illustrating the structure of a semiconductor memory device shown in FIG. 1.

FIG. 2 is a block diagram illustrating the structure of the semiconductor memory device 1000 shown in FIG. 1.

The semiconductor memory device 1000 may include the memory cell array 100, a peripheral circuit 600 and a control circuit 700.

The peripheral circuit 600 may include an address decoder 200, a voltage generator 300, a read and write circuit 400 and a data input/output circuit 500.

The memory cell array 100 may include a plurality of memory blocks BLK1 to BLKz. The memory blocks BLK1 to BLKz may be connected to the address decoder 200 through word lines WL. The memory blocks BLK1 to BLKz may be coupled to the read and write circuit 400 through bit lines BL1 to BLm. Each of the memory blocks BLK1 to BLKz may include a plurality of memory cells. According to an embodiment, the plurality of memory cells may be non-volatile memory cells. Memory cells coupled to the same word line, among the plurality of memory cells, may be defined as a single page. That is, the memory cell array 100 may include a plurality of pages.

In addition, each of the memory blocks BLK1 to BLKz of the memory cell array 100 may include a plurality of cell strings. Each of the cell strings may include a drain selection transistor, a first memory cell group, a pipe transistor, a second memory cell group and a source selection transistor coupled in series between a bit line and a source line.

The peripheral circuit 600 may drive the memory cell array 100 in response to control of the control circuit 700. For example, the control circuit 700 may control the peripheral circuit 600 to drive the memory cell array 100 in order to perform a program operation, a read operation and an erase operation.

The address decoder 200 may be coupled to the memory cell array 110 through the word lines WL. The address decoder 200 may be configured to operate in response to the control circuit 700. The address decoder 200 may receive an address ADDR from the control circuit 700 through an input/output buffer (not illustrated) in the semiconductor memory device 1000.

The address decoder 200 may be configured to decode a block address of the received address ADDR. The address decoder 200 may select at least one of the memory blocks BLK1 to BLKz according to the decoded block address. The address decoder 200 may be configured to decode a row address of the received address ADDR. The address decoder 200 may select at least one word line WL of a selected memory block by applying voltages supplied from the voltage generator 300 to at least one word line WL according to the decoded row address.

During a program operation, the address decoder 200 may apply a program voltage to a selected word line and a pass voltage having a lower voltage level than the program voltage to unselected word lines. During a program verify operation, the address decoder 200 may apply a verify voltage to the selected word line and a verify pass voltage having a higher voltage level than the verify voltage to unselected word lines.

During a read operation, the address decoder 200 may apply a read voltage to the selected word line and a pass voltage having a higher voltage level than the read voltage to the unselected word lines.

According to an embodiment, an erase operation of the semiconductor memory device 1000 may be performed in units of memory blocks. During the erase operation, the address ADDR input to the semiconductor memory device 1000 may include a block address. The address decoder 200 may decode the block address and select one memory block according to the decoded block address. During the erase operation, the address decoder 200 may apply a ground voltage to a word line of the selected memory block.

According to an embodiment, the address decoder 200 may include a block decoder, a word line decoder and an address buffer.

Operations of the address decoder 200 will be described below in more detail with reference to FIG. 5.

The voltage generator 300 may be configured to generate a plurality of voltages by using an external power voltage supplied to the semiconductor memory device 1000. The voltage generator 300 may operate in response to control of the control circuit 700.

According to an embodiment, the voltage generator 300 may regulate the external power voltage to generate an internal power voltage. The internal power voltage generated by the voltage generator 300 may be used as an operating voltage of the semiconductor memory device 1000.

According to an embodiment, the voltage generator 300 may generate a plurality of voltages by using the external power voltage or the internal power voltage. For example, the voltage generator 300 may include a plurality of pumping capacitors receiving the internal power voltage and selectively activate the plurality of pumping capacitors to generate a plurality of voltages in response to control of the control circuit 700. The generated voltages may be applied to word lines selected by the address decoder 200.

The read and write circuit 400 may include first to mth page buffers PB1 to PBm. The first to mth page buffers PB1 to PBm may be coupled to the memory cell array 100 through the first to mth bit lines BL1 to BLm, respectively. The first to mth page buffers PB1 to PBm may operate in response to control of the control circuit 700.

The first to mth page buffers PB1 to PBm may communicate data with the data input/output circuit 500. During a program operation, the first to mth page buffers PB1 to PBm may receive data DATA to be stored through the data input/output circuit 500 and data lines DL.

During a program operation, the first to mth page buffers PB1 to PBm may transfer the data DATA received through the data input/output circuit 500 to selected memory cells through the bit lines BL1 to BLm when a program pulse is applied to the selected word line. Memory cells of a selected page may be programmed according to the transferred data DATA. A memory cell coupled to a bit line to which a program permission voltage for example, a ground voltage is applied, may have an increased threshold voltage. However, a threshold voltage of a memory cell coupled to a bit line to which a program inhibition voltage for example, a power voltage is applied, may be maintained. During a program verify operation, the first to mth page buffers PB1 to PBm may read page data from the selected memory cells through the bit lines BL1 to BLm.

During a read operation, the read and write circuit 400 may read the data DATA through the bit lines BL from the memory cells of the selected page and output the read data DATA to the data input/output circuit 500.

During an erase operation, the read and write circuit 400 may float the bit lines BL. According to an embodiment, the read and write circuit 400 may include a column selection circuit.

The data input/output circuit 500 may be coupled to the first to mth page buffers PB1 to PBm through the data lines DL. The data input/output circuit 500 may operate in response to control of the control circuit 700. During a program operation, the data input/output circuit 500 may receive the data DATA to be stored from an external controller (not illustrated). During a read operation, the data input/output circuit 500 may output the data DATA transferred from the first to mth page buffers PB1 to PBm included in the read and write circuit 400 to an external controller.

The control circuit 700 may be coupled to the address decoder 200, the voltage generator 300, the read and write circuit 400 and the data input/output circuit 500. The control circuit 700 may control overall operations of the semiconductor memory device 1000. The control circuit 700 may receive a command CMD and the address ADDR from the external controller. The control circuit 700 may control the peripheral circuit 600 in response to the command CMD. The control circuit 700 may control the address decoder 200, the voltage generator 300, the read and write circuit 400 and the data input/output circuit 500 to perform an operation corresponding to the received command CMD. According to an embodiment, the control circuit 700 may apply an erase voltage Verase, which is a high voltage, to the source line during an erase operation.

Figure 3:
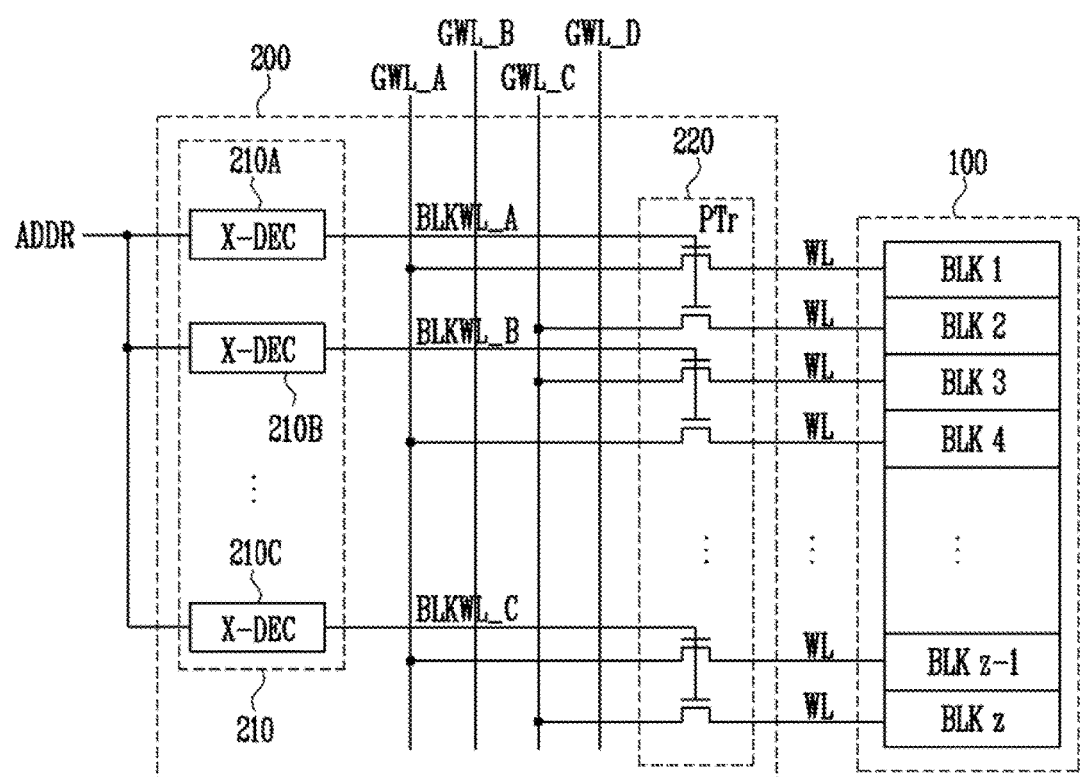
FIG. 3 is a block diagram illustrating the structure of an address decoder shown in FIG. 2.

FIG. 3 is a block diagram illustrating the structure of the address decoder 200.

Referring to FIG. 3, the address decoder 200 may include a block decoder unit 210 and a pass unit 220.

The block decoder unit 210 may include a plurality of block decoders 210A to 210C. Each of the block decoders 210A to 210C may correspond to one or more among the memory blocks BLK1 to BLKz. For example, one block decoder such as, the block decoder 210A may correspond to two memory blocks such as, the memory blocks BLK1 and BLK2. According to an embodiment, two memory blocks may correspond to one block decoder. However, two or more memory blocks may correspond to one block decoder. That is, a plurality of memory blocks may be commonly coupled to one block decoder. Therefore, a plurality of memory blocks may share one block word line.

Each of the block decoders 210A to 210C may output one of block selection signals BLKWL_A to BLKWL_C to a block word line in response to the address ADDR. The block selection signals BLKWL_A to BLKWL_C may be input to the pass unit 220 through block word lines. For example, the block decoder 210A may output the block selection signal BLKWL_A in response to the address ADDR, the block decoder 210B may output a block selection signal BLKWL_B in response to the address ADDR, and the block decoder 210C may output the block selection signal BLKWL_C in response to the address ADDR.

The pass unit 122 may include a plurality of pass transistors PTr. The plurality of pass transistors PTr may correspond to the memory blocks BLK1 to BLKz, respectively. In addition, the pass transistors PTr may electrically connect global word line groups GWL_A to GWL_D to local word lines WL of the memory blocks BLK1 to BLKz, respectively, in response to the block selection signals BLKWL_A to BLKWL_C. For example, the pass transistors PTr corresponding to the first and second memory blocks BLK1 and BLK2 among the plurality of pass transistors PTr included in the pass unit 122 may be turned on or off in response to the block selection signal BLKWL_A output from the block decoder 210A. In addition, the pass transistors PTr corresponding to the third and fourth memory blocks BLK3 and BLK4 may be turned on or off in response to the block selection signal BLKWL_B output from the block decoder 210B. The pass transistors PTr corresponding to (z−1)th and zth memory blocks BLKz−1 and BLKz may be turned on or off in response to the block selection signal BLKWL_C output from the block decoder 210C.

Therefore, when the first memory block BLK1 is selected from among the memory blocks BLK1 to BLKz, the pass transistors PTr corresponding to the first and second memory blocks BLK1 and BLK2 sharing the block decoder 210A may be turned on by the block selection signal BLKWL_A.

In the present specification, a memory block selected by an address decoder, such as the first memory block BLK1, may be referred to as a selected block SELECTED BLK, a memory block, such as the second memory block BLK2 sharing the selected first memory block BLK1 with the block decoder 210A, may be referred to as a shared block SHARED BLK, and memory blocks, such as the third to zth memory blocks BLK3 to BLKz which are not selected, may be referred to as unselected blocks UNSELECTED BLK.

Figure 4:
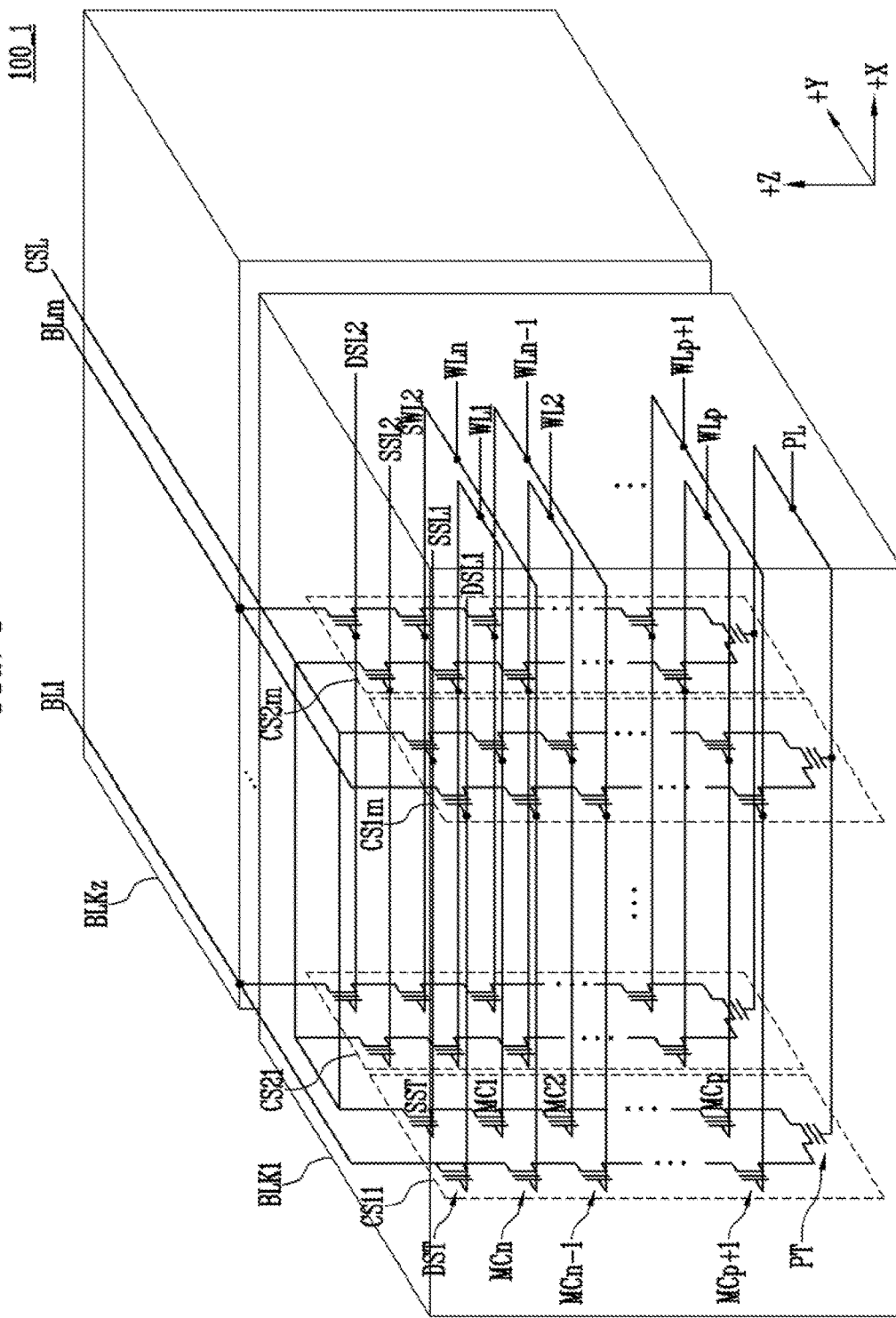
FIG. 4 is a diagram illustrating an embodiment of a memory cell array shown in FIG. 2.

FIG. 4 is a diagram illustrating an embodiment of the memory cell array shown in FIG. 4.

Referring to FIG. 4, a memory cell array 100_1 may include the memory blocks BLK1 to BLKz. In FIG. 4, for illustrative purpose, the internal configuration of the first memory block BLK1 is shown, and the internal configurations of the memory blocks BLK2 to BLKz are omitted. However, it will be understood that the second to zth memory blocks BLK2 to BLKz are configured in substantially the same manner as the first memory block BLK1.

Referring to FIG. 4, the first memory block BLK1 may include a plurality of cell strings CS11 to CS1m and CS21 to CS2m. According to an embodiment, each of the cell strings CS11 to CS1m and CS21 to CS2m may be formed into a 'U' shape. In the first memory block BLK1, m cell strings may be arranged in a row direction that is, +X direction. For convenience of description, FIG. 4 illustrates two cell strings arranged in a column direction that is, +Y direction. However, three or more cell strings may be arranged in the column direction.

Each of the cell strings CS11 to CS1m and CS21 to CS2m may include at least one source selection transistor SST, first to nth memory cells MC1 to MCn, a pipe transistor PT, and at least one drain selection transistor DST.

The source and drain selection transistors SST and DST and the memory cells MC1 to MCn may have similar structures to each other. According to an embodiment, each of the source and drain selection transistors SST and DST and the memory cells MC1 to MCn may include a channel layer, a tunneling insulating layer, a charge storing layer and a blocking insulating layer. According to an embodiment, a pillar for providing a channel layer may be formed in each cell string. According to an embodiment, a pillar for providing at least one of the channel layer, the tunneling insulating layer, the charge storing layer and the blocking insulating layer may be provided in each cell string.

The source selection transistor SST of each cell string may be connected between a common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 5, source selection transistors of the cell strings CS11 to CS1$m$ in the first row may be coupled to a first source selection line SSL1, and source selection transistors of the cell strings CS21 to CS2$m$ in the second row may be connected to a second source selection line SSL2.

According to another embodiment, the source selection transistors of the cell strings CS11 to CS1$m$ and CS21 to CS2$m$ may be commonly coupled to one source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be arranged in a sequential manner along a +Z direction and a reverse direction, and be coupled in series between the source selection transistor SST and the pipe transistor PT. The (p+1)th to nth memory cells MCp+1 to MCn may be sequentially arranged in the +Z direction and be coupled in series between the pipe transistor PT and the drain selection transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each cell string may be coupled to the first to nth word lines WL1 to WLn, respectively.

According to an embodiment, at least one of the first to nth memory cells MC1 to MCn may serve as a dummy memory cell. When the dummy memory cell is provided, a voltage or current of the corresponding cell string may be stably controlled. As a result, the reliability of data stored in the first memory block BLK1 may be improved.

A gate of the pipe transistor PT of each cell string may be coupled to a pipe line PL.

The drain selection transistor DST of each cell string may be coupled between the corresponding bit line and the memory cells MCp+1 to MCn. Cell strings arranged in a row direction may be coupled to a drain selection line extending in the row direction. Drain selection transistors of the cell strings CS11 to CS1$m$ in the first row may be coupled to a first drain selection line DSL1. Drain selection transistors of the cell strings CS21 to CS2$m$ in the second row may be coupled to a second drain selection line DSL2.

Cell strings arranged in a column direction may be coupled to a bit line extending in the column direction. In FIG. 4, the cell strings CS11 and CS21 in the first column may be coupled to the first bit line BL1. The cell strings CS1$m$ and CS2$m$ in an mth column may be coupled to the mth bit line BLm.

Memory cells coupled to the same word line in cell strings arranged in the row direction may form a single page coupled to the same word line. For example, memory cells coupled to the first word line WL1 in the cell strings CS11 to CS1$m$ in the first row may form a single page. Memory cells coupled to the first word line WL1 in the cell strings CS21 to CS2$m$ in the second row may form another single page. Cell strings arranged in one row direction may be selected by selecting one between the drain selection lines DSL1 and DSL2. One page may be selected from among the selected cell strings according to one of the word lines WL1 to WLn.

Figure 5:
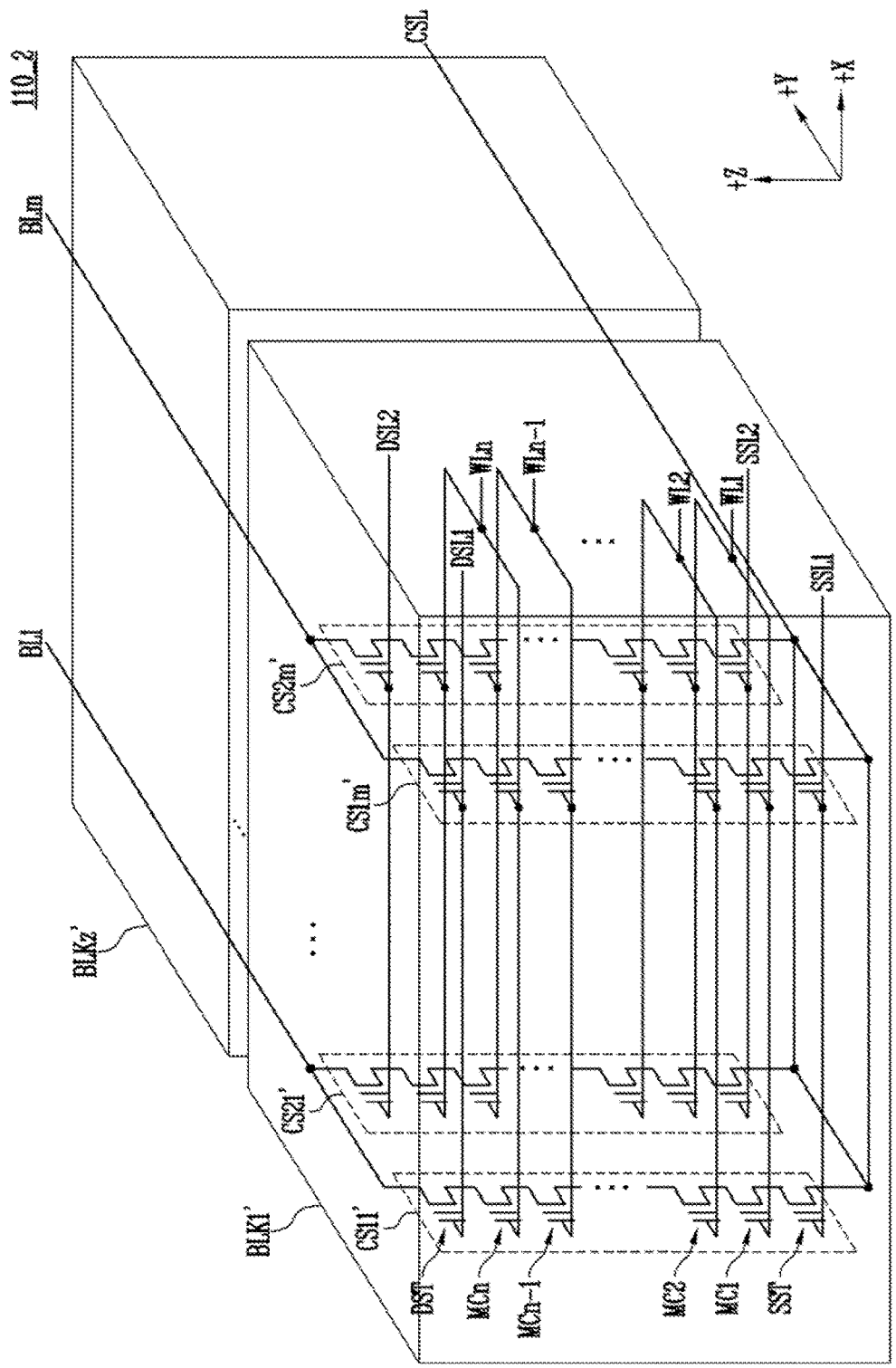
FIG. 5 is a diagram illustrating another embodiment of a memory cell array shown in FIG. 2.

FIG. 5 is a diagram illustrating another embodiment of a memory cell array shown in FIG. 2.

Referring to FIG. 5, a memory cell array 100_2 may include a plurality of memory blocks BLK1' to BLKz'. In FIG. 5, for illustrative purpose, the internal configuration of the first memory block BLK1' is illustrated and the internal configurations of memory blocks BLK2' to BLKz' are omitted. The second to zth memory blocks BLK2' to BLKz' may be configured in substantially the same manner as the first memory block BLK1'.

The first memory block BLK1' may include a plurality of cell strings CS11' to CS1$m$' and CS21' to CS2$m$'. Each of the cell strings CS11' to CS1$m$' and CS21' to CS2$m$' may extend in a +Z direction. In the first memory block BLK1', m cell strings may be arranged in the +X direction. For convenience of description, FIG. 5 illustrates two cell strings arranged in a +Y direction. However, three or more cell strings may be arranged in a column direction.

Each of the cell strings CS11' to CS1$m$' and CS21' to CS2$m$' may include at least one source selection transistor SST, the first to nth memory cells MC1 to MCn, and at least one drain selection transistor DST.

The source selection transistor SST of each cell string may be coupled between the common source line CSL and the memory cells MC1 to MCn. Source selection transistors of cell strings arranged in the same row may be connected to the same source selection line. Source selection transistors of the cell strings CS11' to CS1$m$' arranged in the first row may be coupled to the first source selection line SSL1. Source selection transistors of the cell strings CS21' to CS2$m$' arranged in the second row may be coupled to the second source selection line SSL2. According to another embodiment, the source selection transistors of the cell strings CS11' to CS1$m$' and CS21' to CS2$m$' may be commonly connected to one source selection line.

The first to nth memory cells MC1 to MCn of each cell string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When the dummy memory cell is provided, a voltage or current of the corresponding cell string may be stably controlled. Therefore, the reliability of data stored in the memory block BLK1' may be improved.

The drain selection transistor DST of each cell string may be coupled between the corresponding bit line and the memory cells MC1 to MCn. Drain selection transistors of cell strings arranged in a row direction may be coupled to a drain selection line extending in the row direction. The drain selection transistors of the cell strings CS11' to CS1$m$' in the first row may be coupled to the first drain selection line DSL1. The drain selection transistors of the cell strings CS21' to CS2$m$' in the second row may be coupled to the second drain selection line DSL2.

As a result, the memory block BLK1' shown in FIG. 5 may have a similar equivalent circuit to the first memory block BLK1 shown in FIG. 4, except that the pipe transistor PT Is removed from each cell string.

Figure 6:
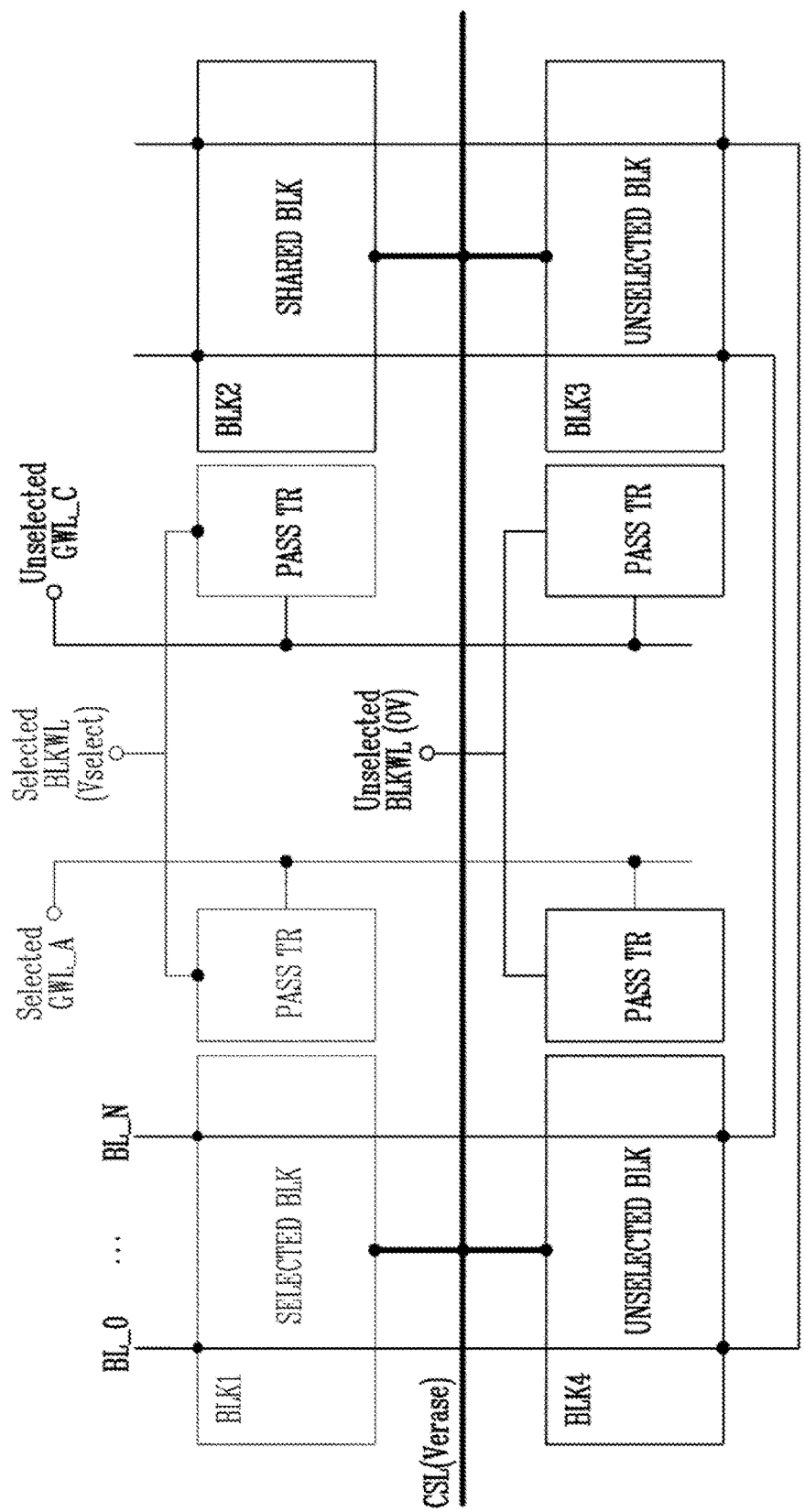
FIG. 6 is a diagram illustrating an erase operation of a semiconductor memory device.

FIG. 6 is a diagram illustrating an erase operation of a semiconductor memory device.

Referring to FIG. 6, the first to fourth memory blocks BLK1 to BLK4 may be commonly coupled to zeroth to Nth bit lines. The first to fourth memory blocks BLK1 to BLK4 may be included in the memory cell array 100 described with reference to FIGS. 4 and 5. Gate electrodes of memory cells included in the first to fourth memory blocks BLK1 to BLK4 may be coupled to local word lines. The local word lines may be coupled to a global word line A GWL_A or a global word line C GWL_C through the pass transistor PASS TR. For convenience of description, FIG. 6 illustrates the memory cell array including four memory blocks, that is, the first to fourth memory blocks BLK1 to BLK4. However, according to an embodiment, the memory cell array may have five or more memory blocks.

Local word lines of the first memory block BLK1 may be coupled to the global word line A GWL_A through the pass transistor PASS TR. Local word lines of the second memory block BLK2 may be coupled to the global word line C GWL_C through the pass transistor PASS TR. Local word lines of the third memory block BLK3 may be coupled to the global word line C GWL_C through the pass transistor PASS TR. Local word lines of the fourth memory block BLK4 may be coupled to the global word line A GWL_A through the pass transistor PASS TR.

The pass transistors PASS TRs corresponding to the first memory block BLK1 and the second memory block BLK2 may be commonly coupled to one block word line. Therefore, the first memory block BLK1 and the second memory block BLK2 may share one block decoder.

The pass transistors PASS TRs corresponding to the third memory block BLK3 and the fourth memory block BLK4 may be commonly coupled to one block word line. Therefore, the third memory block BLK3 and the fourth memory block BLK4 may share one block decoder.

FIG. 6 illustrates as an example of an erase operation to the first memory block BLK1 among the first to fourth memory blocks BLK1 to BLK4.

The selected first memory block BLK1 may be a selected block SELECTED BLK, the second memory block BLK2 sharing the block word line BLKWL with the selected first memory block BLK1 may be a shared block SHARED BLK, and unselected third and fourth memory blocks BLK3 and BLK4 may be unselected blocks UNSELECTED BLKs.

The block word line BLKWL coupled to the pass transistor PASS TR of the first memory block BLK1 may be turned on according to a block selection voltage Vselect provided through a selected block word line SELECTED BLKWL. Since the pass transistor PASS TR of the second memory block BLK2 and the pass transistor PASS TR of the first memory block BLK1 share the selected block word line SELECTED BLKWL, the same block selection voltage Vselect may be applied to the pass transistor PASS TR of the second memory block BLK2.

Since the first memory block BLK1 is erased, the global word line A GWL_A may be selected and the global word line C GWL_C may not be selected.

Unselected block word lines UNSELECTED BLKWL may provide the pass transistors PASS TRs of the third and fourth memory blocks BLK3 and BLK4 that is, the unselected blocks UNSELECTED BLKs, with a ground voltage (0V).

Figure 7:
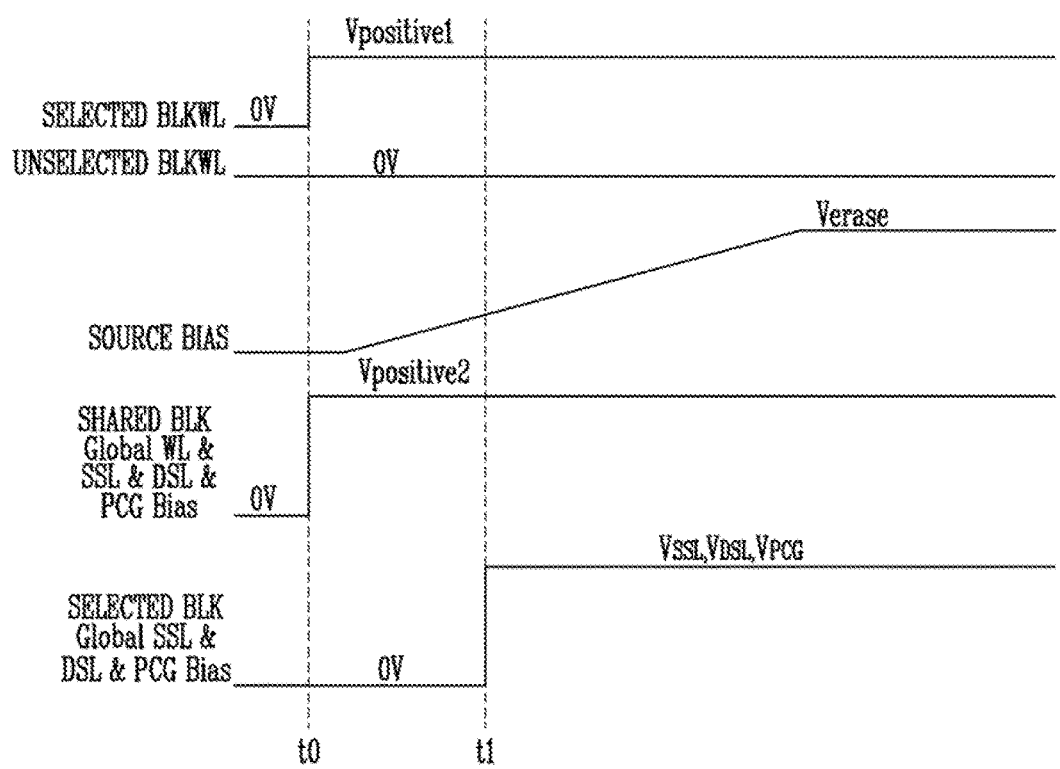
FIG. 7 is a diagram illustrating voltages applied during an erase operation of a semiconductor memory device.

FIG. 7 is a diagram illustrating voltages applied when an erase operation of a semiconductor memory device is performed.

FIG. 8 is a diagram illustrating operations of memory blocks when an erase operation of a semiconductor memory device is performed.

During an erase operation, the semiconductor memory device may generate the erase voltage Verase and apply the generated erase voltage Verase to the common source line CSL which is denoted as "SOURCE BIAS" in FIG. 7. At this time, the source selection transistor SST and the drain selection transistor DST may be controlled to be floated.

A ground voltage may be applied to local word lines of a selected memory block. Subsequently, a potential level of a channel may be increased by a potential level of the common source line CSL. Potential levels of source selection lines and drain selection lines coupled to a plurality of source selection transistors SSTs and a plurality of drain selection transistors DSTs in floating states may be increased by the potential level of the channel through a coupling phenomenon.

Data stored in memory cells of the selected memory block may be erased by the increased potential level of the channel. That is, electrons stored in charge storing layers of the memory cells of the selected memory block may be detrapped by the potential of the channel. More specifically, the electrons stored in the charge storing layers of the memory cells of the selected memory block may flow into the channel to be detrapped by the difference between the increased potential level of the channel and the potential levels of the local word lines having a ground level. Hot holes generated in the channel may flow into the charge storing layers of the memory cells, so that the electrons stored in the charge storing layers may be detrapped. The local word lines may maintain the ground level, or change from the floating state into the ground level.

After the data of the memory cells of the selected memory block is erased as a result of the erase operation, the erase voltage Verase being applied to the common source line CSL may be blocked and the potential of the common source line CSL may be discharged.

When the erase voltage Verase having a high voltage level is applied to the common source line CSL during the erase operation, gate induce drain leakage (GIDL) may occur due to a voltage difference from a source side, and hot holes may be generated and introduced in a direction of the channel since the source selection transistor SST is floated. As a result, the potential of the channel may Increase. At this time, the bit line may remain floated. The erase voltage Verase may be transferred to the bit line in the floating state by a channel of an erased block and coupling capacitance between the common source line CSL and the bit lines.

Since word line voltages are 0V in the selected memory block, hot holes may tunnel into the memory cells to erase the data of the memory cells.

However, a voltage of a bit line may be lower than the erase voltage of the common source line CSL due to a built-in potential or a coupling ratio. Therefore, the potential difference between the common source line CSL and the bit lines may cause the potential of the channel and holes to be introduced in a bit line direction. As a result, erase characteristics may be deteriorated.

In the address decoder, in which the block word line is shared as described above with reference to FIG. 6, a selected block and a shared block may coexist when a pass transistor connecting a global word line and a local word line is turned on.

Referring to FIGS. 7 and 8, at time t0, since a ground voltage is applied to a local word line to erase a selected memory block, a first positive voltage (Vpositive1=Vselect) may be applied to a selected block word line SELECTED BLKWL to turn on the pass transistors PASS TRs of the selected block SELECTED BLK and the shared block SHARED BLK.

A ground voltage (0V) may be applied to an unselected block word line UNSELECTED BLKWL coupled to the unselected memory blocks UNSELECTED BLKs.

Local word lines of the shared block SHARED BLK may be floated to avoid an erase phenomenon. A second positive voltage (Vpositive2=Vglobal) having a higher voltage level than the selected block word line SELECTED BLKWL coupled to the shared block SHARED BLK may be applied to the global word line Global WL, a source selection line SSL, a drain selection line DSL and a pipe cell gate PCG coupled to the shared block SHARED BLK. Therefore, the local word lines of the shared block SHARED BLK may be floated when charged with a lower potential Vlocal than the selected block word line SELECTED BLKWL.

At time t1, a global source selection line Global SSL, a drain selection line DSL and a pipe cell gate PCG of the selected memory block SELECTED BLK may have a source selection line voltage VSSL, a drain selection line voltage VDSL and a pipe cell voltage VPCG, respectively.

Therefore, when threshold voltages of memory cells Included in the shared block SHARED BLK are low, the memory cells may be turned on and the erase voltage Verase may be transferred from a source side SO to the bit line BL, so that the bit line BL may be precharged (refer to "SHARED BLK (Low Vt)" of FIG. 8). However, when the threshold voltages of the memory cells are high, the memory cells may be turned off, the erase voltage Verase may not be transferred from the source side SO to the bit line BL, and it may be impossible to precharge the bit line (refer to "SHARED BLK (High Vt)" of FIG. 8).

According to an embodiment, the erase voltage Verase may be transferred to the bit line to precharge the bit line by turning on the memory cells included in the shared block SHARED BLK even when the threshold voltages of the memory cells are high.

Figure 9:
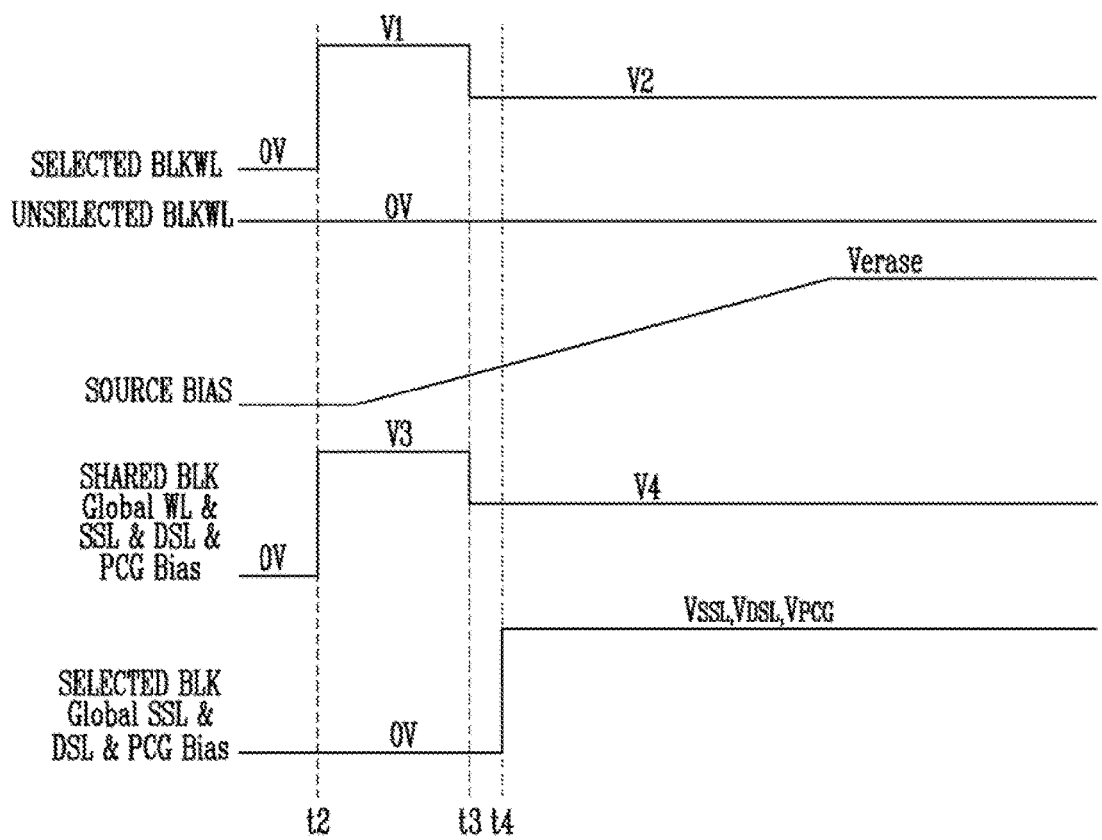
FIG. 9 is a diagram illustrating an erase method according to an embodiment.

FIG. 9 is a diagram illustrating an erase method according to an embodiment.

Referring to FIG. 9, at time t2, the erase voltage Verase may be applied to a source line SOURCE BIAS.

A first voltage V1 may be applied to the selected block word line SHARED BLKWL of the selected block SELECTED BLK and the shared block SHARED BLK. The first voltage V1 may be applied to turn on pass transistors PASS TRs of the selected block SELECTED BLK and the shared block SHARED BLK. According to an embodiment, the first voltage V1 may have a higher voltage level than a voltage to turn on the pass transistors PASS TRs of the selected block SELECTED BLK and the shared block SHARED BLK by a predetermined value.

A ground voltage (0V) may be applied to an unselected block word line UNSELECTED BLKWL coupled to an unselected block UNSELECTED BLK.

A third voltage V3 may be applied to the global word line Global WL, the source selection line SSL, the drain selection line DSL, and the pipe cell gate PCG coupled to the shared block SHARED BLK. To avoid an erase phenomenon of the shared block SHARED BLK, the third voltage V3 may be applied to float local word lines coupled to the shared block SHARED BLK. According to an embodiment, the third voltage V3 may be applied to float the local word lines of the shared block SHARED BLK in response to a voltage level of the first voltage V1.

At time t3, a second voltage V2 having a lower voltage level than the first voltage V1 may be applied to the selected block word line SELECTED BLKWL shared by the selected block SELECTED BLK and the shared block SHARED BLK. According to an embodiment, the second voltage V2 may be applied to turn on the pass transistors PASS TRs of the selected block SELECTED BLK and the shared block SHARED BLK.

A fourth voltage V4 having a lower voltage level than the third voltage V3 may be applied to the global word line Global WL, the source selection line SSL, the drain selection line DSL, and the pipe cell gate PCG coupled to the shared block SHARED BLK. According to an embodiment, the fourth voltage V4 may be applied to float the local word lines of the shared block SHARED BLK in response to a voltage level of the second voltage V2.

At time t4, the global source selection line Global SSL, the drain selection line DSL and the pipe cell gate PCG coupled to a selected block SELECTED BLK may have the source selection line voltage VSSL, the drain selection line voltage VDSL and the pipe cell voltage VPCG, respectively.

According to the embodiment shown in FIG. 9, the first voltage V1 and the third voltage V3 higher than the first positive voltage Vpositive1 and the second positive voltage Vpositive2 described with reference to FIG. 7 by predetermined voltage levels may be applied to the selected block word line SELECTED BLKWL of the selected block SELECTED BLK and the shared block SHARED BLK, and the global word line Global WL, the source selection line SSL, the drain selection line DSL, and the pipe cell gate PCG coupled to the shared block SHARED BLK for a predetermined reference time. Accordingly, the memory cells included in the shared block SHARED BLK may be turned on for a short period of time at an early stage of the erase operation, and thus potentials of the floated local word lines may be increased. Therefore, even when the memory cells included in the shared block SHARED BLK have high threshold voltages, the erase voltage Verase may be transferred to the bit line to precharge the bit line and thus the erase operation may be performed faster.

Figure 10:
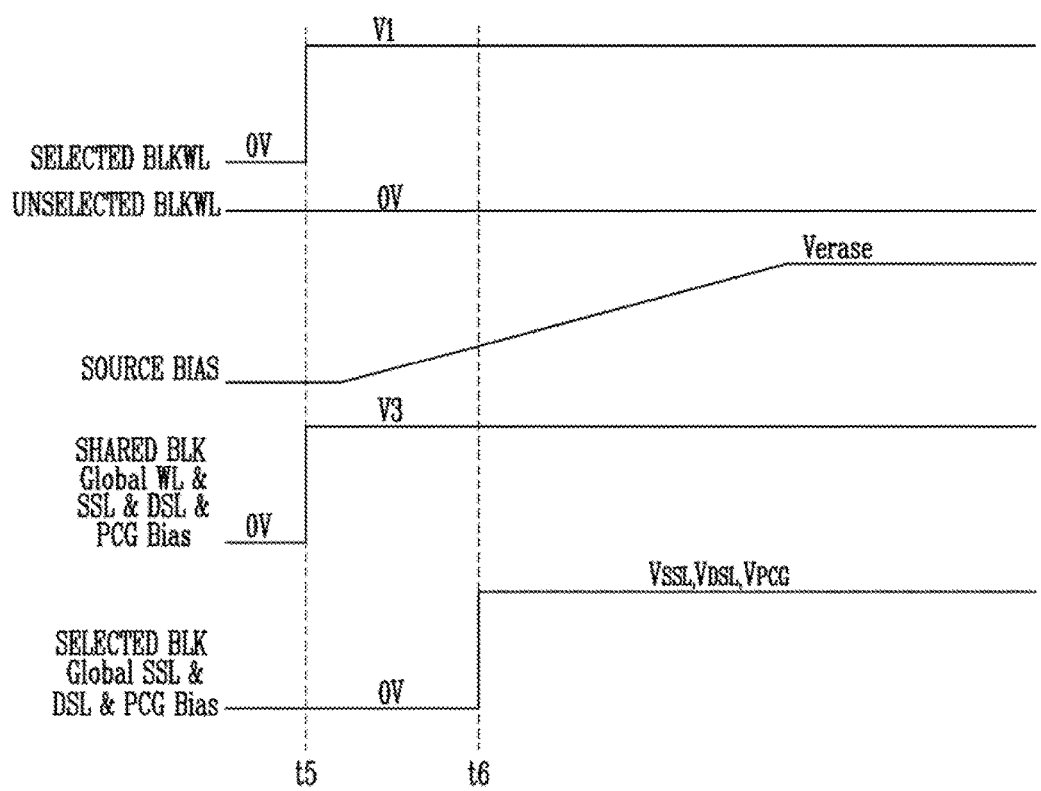
FIG. 10 is a diagram illustrating another embodiment.

FIG. 10 is a diagram illustrating an erase method according to another embodiment.

Referring to FIG. 10, at time t5, the erase voltage Verase may be applied to the source line SOURCE BIAS.

The first voltage V1 may be applied to the selected block word line SELECTED BLKWL of the selected block SELECTED BLK and the shared block SHARED BLK. The first voltage V1 may be applied to turn on the pass transistors PASS TRs of the selected block SELECTED BLK and the shared block SHARED BLK. According to an embodiment, the first voltage V1 may have a higher voltage level than a voltage applied to turn on the pass transistors PASS TRs of the selected block SELECTED BLK and the shared block SHARED BLK by a predetermined value.

A ground voltage (0V) may be applied to the unselected block word line UNSELECTED BLKWL of the unselected block UNSELECTED BLK.

The third voltage V3 may be applied to the global word line Global WL, the source selection line SSL, the drain selection line DSL, and the pipe cell gate PCG coupled to the shared block SHARED BLK. The third voltage V3 may be applied to float the local word lines of the shared block SHARED BLK so as to avoid an erase phenomenon of the shared block SHARED BLK. According to an embodiment, the third voltage V3 may be applied to float the local word lines of the shared block SHARED BLK in response to a voltage level of the first voltage V1.

Contrary to the embodiment shown in FIG. 9, in the embodiment shown in FIG. 10, while the voltages applied to the selected block word line SELECTED BLKWL of the selected block SELECTED BLK and the shared block SHARED BLK and the global word line Global WL, the source selection line SSL, the drain selection line DSL, the pipe cell gate PCG coupled to the shared block SHARED BLK are not changed, the memory cells included in the shared block SHARED BLK may remain turned on.

At time t6, the global source selection line Global SSL, the drain selection line DSL and the pipe cell gate PCG coupled to the selected block SELECTED BLK may have the source selection line voltage VSSL, the drain selection line voltage VDSL and the pipe cell voltage VPCG, respectively.

According to the embodiment shown in FIG. 10, the first voltage V1 and the third voltage V3 higher than the first positive voltage Vpositive1 and the second positive voltage Vpositive2 described with reference to FIG. 7 by predetermined voltage levels may continue to be applied to the selected block word line SELECTED BLKWL of the selected block SELECTED BLK and the shared block SHARED BLK and the global word line Global WL, the source selection line SSL, the drain selection line DSL, and the pipe cell gate PCG coupled to the shared block SHARED BLK to turn on the memory cells included in the shared block SHARED BLK, so that potentials of the floated local word lines may increase. Therefore, even when the memory cells included in the shared block SHARED BLK have high threshold voltages, the erase voltage Verase may be transferred to the bit line to precharge the bit line and thus the erase operation may be performed faster.

Figure 11:
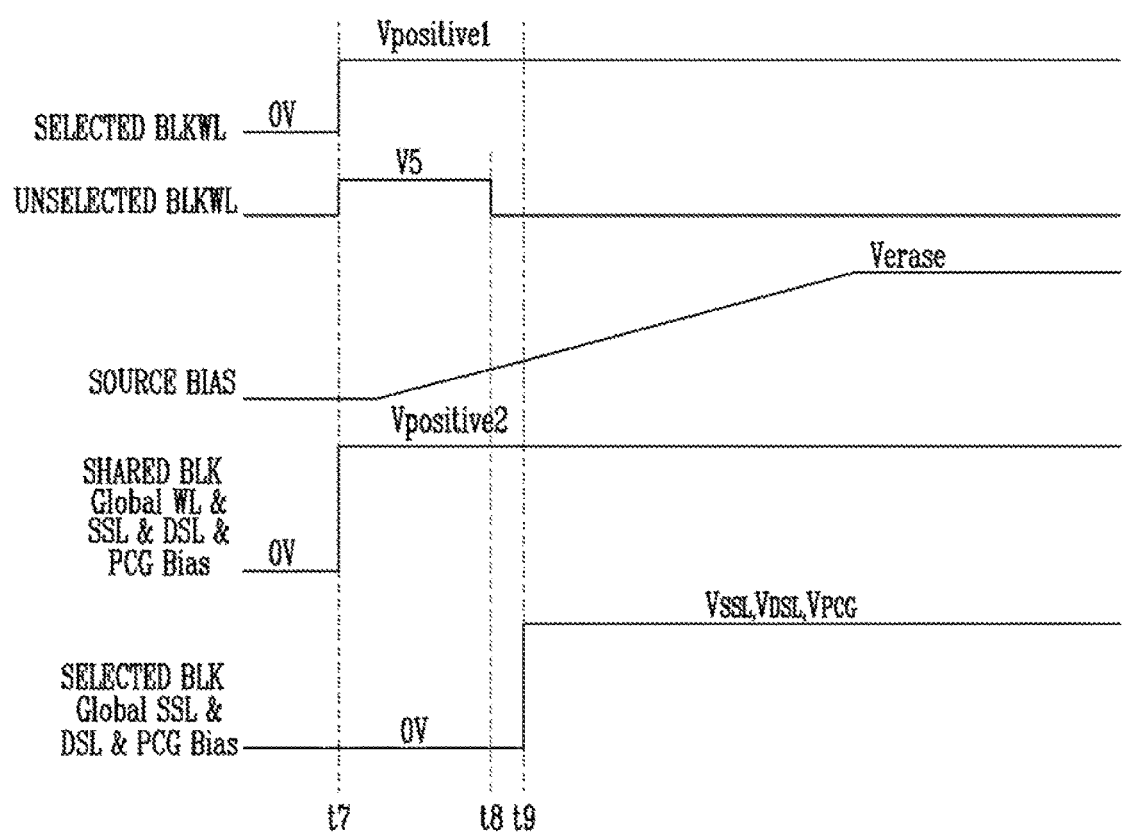
FIG. 11 is a diagram illustrating an erase method according to another embodiment.

FIG. 11 is a diagram illustrating an erase method according to another embodiment.

Referring to FIG. 11, at time t7, the erase voltage Verase may be applied to the source line SOURCE BIAS.

The first positive voltage Vpositive1 may be applied to the selected block word line SELECTED BLKWL of the selected block SELECTED BLK and the shared block SHARED BLK. The first positive voltage Vpositive1 may be applied to turn on the pass transistors PASS TRs of the selected block SELECTED BLK and the shared block SHARED BLK.

A fifth voltage V5 may be applied to the unselected block word line UNSELECTED BLKWL of the unselected block UNSELECTED BLK. According to an embodiment, the fifth voltage V5 may be applied to turn on the pass transistor PASS TR of the unselected block UNSELECTED BLK. According to an embodiment, a global word line voltage of the unselected block UNSELECTED BLK may be maintained in the same manner as the fifth voltage V5.

The second positive voltage Vpositive2 may be applied to the global word line Global WL, the source selection line SSL, the drain selection line DSL, and the pipe cell gate PCG coupled to the shared block SHARED BLK. The second positive voltage Vpositive2 may be applied to float the local word lines of the shared block SHARED BLK to avoid an erase phenomenon of the shared block SHARED BLK. According to an embodiment, the second positive voltage Vpositive2 may be applied to float the local word lines of the shared block SHARED BLK in response to the voltage level of the first positive voltage Vpositive1.

At time t8, the fifth voltage V5 applied to the unselected block word line UNSELECTED BLKWL of the unselected block UNSELECTED BLK may be discharged. That is, a ground voltage may be applied to the unselected block word line UNSELECTED BLKWL of the unselected block UNSELECTED BLK. In the embodiment shown in FIG. 11, memory cells included in the unselected block UNSELECTED BLK may be turned on for a short period of time, so that potentials of the floated local word lines may be increased. Therefore, the erase voltage Verase may be transferred to the bit line to precharge the bit line and thus the erase operation may be performed faster.

At time t8, the global source selection line Global SSL, the drain selection line DSL and the pipe cell gate PCG coupled to the selected block SELECTED BLK may have the source selection line voltage VSSL, the drain selection line voltage VDSL and the pipe cell voltage VPCG, respectively.

Figure 12:
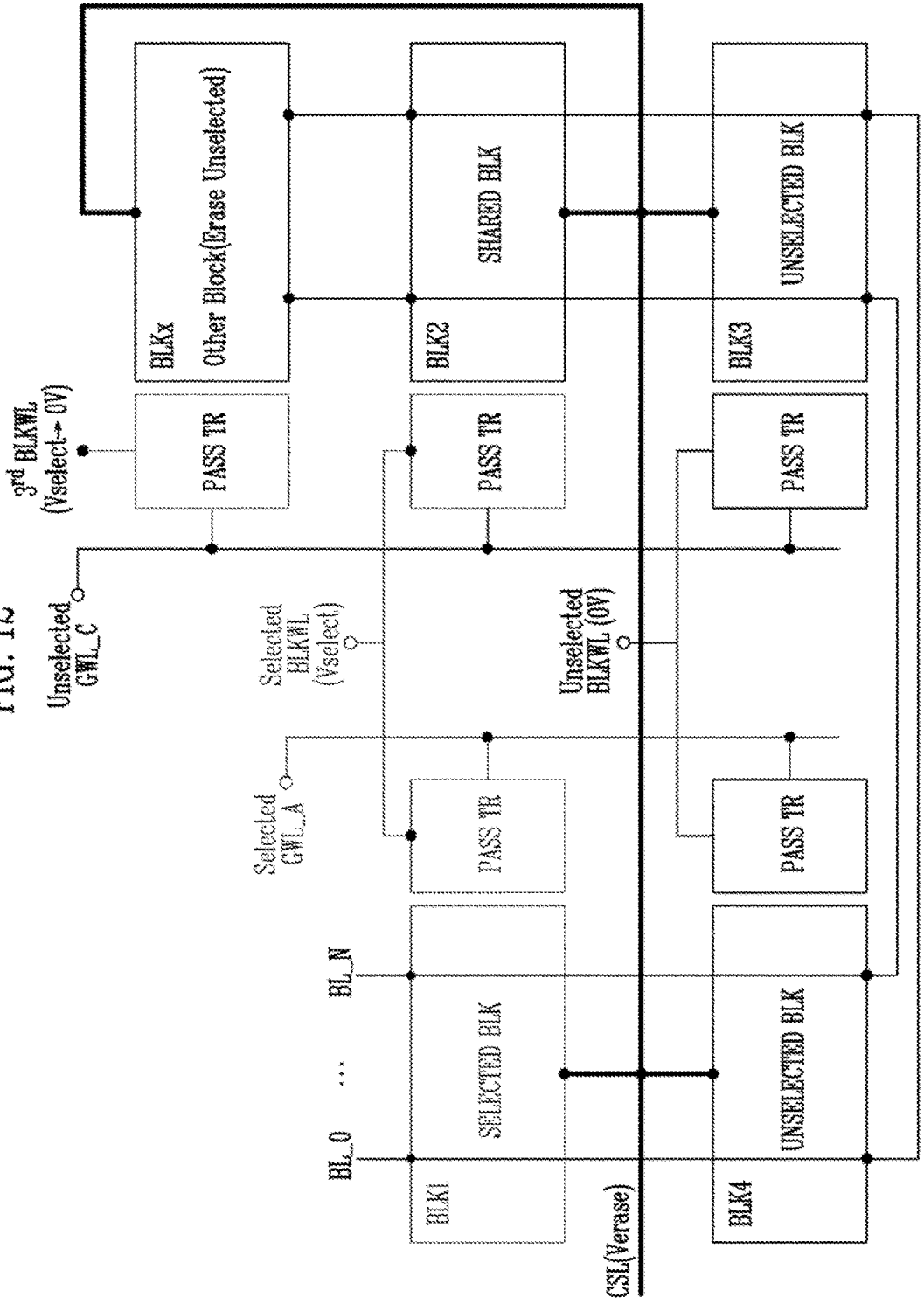
FIG. 12 is a diagram illustrating an erase method according to another embodiment.

FIG. 12 is a diagram illustrating an erase method according to another embodiment.

According to an embodiment shown in FIG. 12, a memory block other than a main block among a plurality of memory blocks included in a semiconductor memory device may serve as a transfer block.

Referring to FIG. 12, the first to fourth memory blocks BLK1 to BLK4 and a transfer block BLKx may be commonly coupled to zeroth to Nth bit lines BL_0 to BL_N. The first to fourth memory blocks BLK1 to BLK4 and the transfer block BLKx may be included in the memory cell array 100 described above with reference to FIGS. 4 and 5. Gate electrodes of memory cells included in the first to fourth memory blocks BLK1 to BLK4 and the transfer block BLKx may be coupled to local word lines, respectively. The local word lines may be coupled to the global word line A GWL_A or the global word line C GWL_C through the pass transistors PASS TR. For convenience of description, FIG. 12 illustrates five memory blocks which are the first to fourth memory blocks BLK1 to BLK4 and the transfer block BLKx, included in the memory cell array. However, according to an embodiment, the memory cell array may include five or more memory blocks.

According to an embodiment, the transfer block BLKx may be a memory block other than a main block configured to store data among the plurality of memory blocks included in the semiconductor memory device. For example, the transfer block BLKx may correspond to one of a system block configured to store system operation information of the semiconductor memory device and a repair block including redundancy strings necessary for a repair operation.

Local word lines of the first memory block BLK1 may be coupled to the global word line A GWL_A through the pass transistor PASS TR. Local word lines of the second memory block BLK2 may be coupled to the global word line C GWL_C through the pass transistor PASS TR. Local word lines of the third memory block BLK3 may be coupled to the global word line C GWL_C through the pass transistor PASS TR. Local word lines of the fourth memory block BLK4 may be coupled to the global word line A GWL_A through the pass transistor PASS TR. Local word lines of the transfer block BLKx may be coupled to the global word line C GWL_C through the pass transistor PASS TR.

The pass transistors PASS TR corresponding to the first memory block BLK1 and the second memory block BLK2 may be commonly coupled to one block word line. Therefore, the first memory block BLK1 and the second memory block BLK2 may share one block decoder, for example, one of the block decoders 210A to 210C, as described with reference to FIG. 3.

The pass transistors PASS TR corresponding to the third memory block BLK3 and the fourth memory block BLK4 may be commonly coupled to one block word line. Therefore, the third memory block BLK3 and the fourth memory block BLK4 may share one block decoder.

FIG. 12 illustrates an example of the erase operation to the first memory block BLK1 among the first to fourth memory blocks BLK1 to BLK4.

The selected first memory block BLK1 may be a selected block SELECTED BLK, and the second memory block BLK2 sharing the block word line BLKWL with the selected first memory block BLK1 may be the shared block SHARED BLK. Unselected third and fourth memory block BLK3 and BLK4 may be the unselected blocks UNSELECTED BLKs.

The block word line BLKWL coupled to the pass transistor PASS TR of the first memory block BLK1 may be turned on according to the block selection voltage Vselect provided through the selected block word line SELECTED BLKWL. Since the pass transistor PASS TR of the second memory block BLK2 shares the selected block word line SELECTED BLKWL with the pass transistor PASS TR of the first memory block BLK1, the same block selection voltage Vselect to the pass transistor PASS TR of the second memory block BLK2 may be applied.

Since the first memory block BLK1 is to be erased, the global word line A GWL_A may be selected, and the global word line C GWL_C may not be selected.

A block word line coupled to the pass transistors PASS TR of the third and fourth memory blocks BLK3 and BLK4 which are the unselected blocks UNSELECTED BLK may be an unselected word line UNSELECTED BLKWL to which a ground voltage (0V) may be applied.

According to an erase method, the first voltage V1 and the third voltage V3 higher than the first positive voltage Vpositive1 and the second positive voltage Vpositive2 described with reference to FIG. 7 by predetermined voltage levels may be applied to the selected block word line SELECTED BLKWL of the selected block SELECTED BLK and the shared block SHARED BLK and the global word line Global WL, the source selection line SSL, the drain selection line DSL, the pipe cell gate PCG coupled to the shared block SHARED BLK of for a predetermined reference time. Accordingly, the memory cells included in the shared block SHARED BLK may be turned on for a short period of time at an early stage of the erase operation, and thus potentials of the floated local word lines may be increased. Therefore, even when the memory cells included in the shared block SHARED BLK have high threshold voltages, the erase voltage Verase may be transferred to the bit line to precharge the bit line and thus the erase operation may be performed faster.

In the embodiment shown in FIG. 12, a first transfer block word line voltage $3^{rd}$ BLKWL may be applied to a gate electrode of a pass transistor PASS TR of the transfer block BLKx. According to an embodiment, the first transfer block word line voltage $3^{rd}$ BLKWL may be a turn-on voltage Vselect of the pass transistor PASS TR of the transfer block BLKx. Thus, the pass transistor PASS TR of the transfer block BLKx may be turned on so that a voltage of the global word line C GWL_C may be transferred to the local word line of the transfer block BLKx. Subsequently, the semiconductor memory device may discharge the transfer block word line voltage $3^{rd}$ BLKWL and apply a second transfer block word line voltage. According to an embodiment, the second transfer block word line voltage may be a ground voltage that is, 0V. Therefore, the local word line of the transfer block BLKx may be set to a floating state from a positive voltage state. The time during which the first transfer block word line voltage $3^{rd}$ BLKWL that is, Vselect is applied may be a time during which the local word line of the transfer block is floated when the second transfer block word line voltage (0V) is subsequently applied.

When the local word line of the transfer block BLKx is floated, the erase voltage Verase applied to the common source line may be transferred to a floated bit line so that a bit line potential may be equal to or greater than the common source line. Therefore, the erase operation may be performed regardless of threshold voltages of memory cells of the shared block SHARED BLK.

Figure 13:
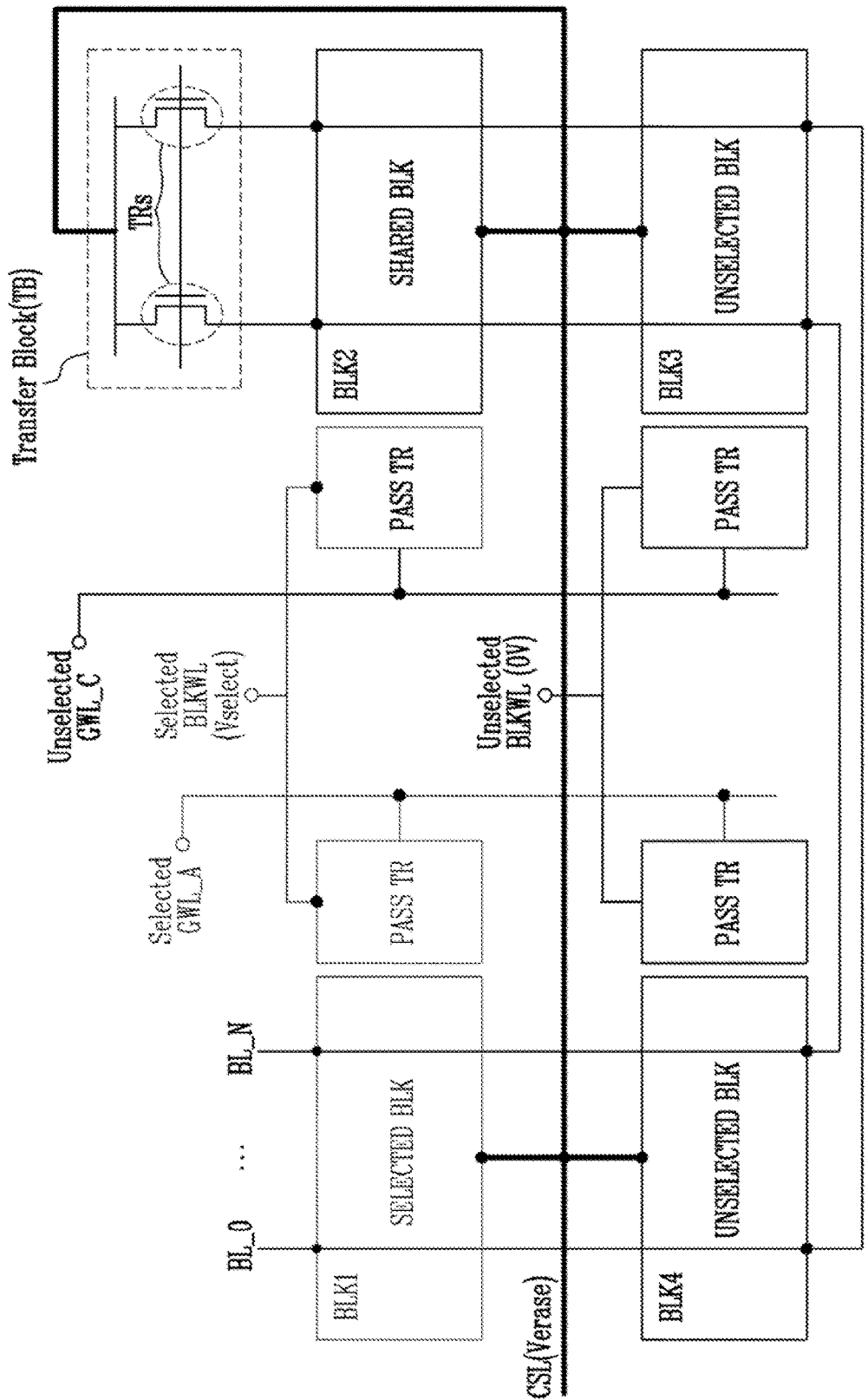
FIG. 13 is a diagram illustrating an erase method according to another embodiment.

FIG. 13 is a diagram illustrating an erase method according to another embodiment.

In the embodiment shown in FIG. 13, the transfer block BLKx described with reference to FIG. 12 is replaced by the transfer block TB including the plurality of switch transistors Tr. Referring to FIG. 13, a memory cell array may further include a transfer block TB adjacent to a shared block SHARED BLK. The transfer block TB may include switch transistors Tr coupling the common source line CSL to a bit line. According to an embodiment, a turn on bias may be applied to gate electrodes of the switches Tr at an early stage of the erase operation. The transfer block TB may precharge the bit line to a voltage of the common source line and the erase voltage Verase in a direction from the bit line.

According to the embodiment shown in FIG. 13, the same operating effects as shown in FIG. 12 may be obtained by providing a separate transfer block TB so as not to damage data of a system block or a repair block.

First electrodes of the switch transistors Tr included in the transfer block TB may be coupled to bit lines and second electrodes thereof may be coupled to a common source line. Therefore, regardless of threshold voltages of the memory cells in the shared block SHARED BLK, a source bias may be transferred in a direction toward the bit line. According to an embodiment, the first electrode may be a drain electrode and the second electrode may be a source electrode, or the first electrode may be a source electrode and the second electrode may be a drain electrode.

Figure 14:
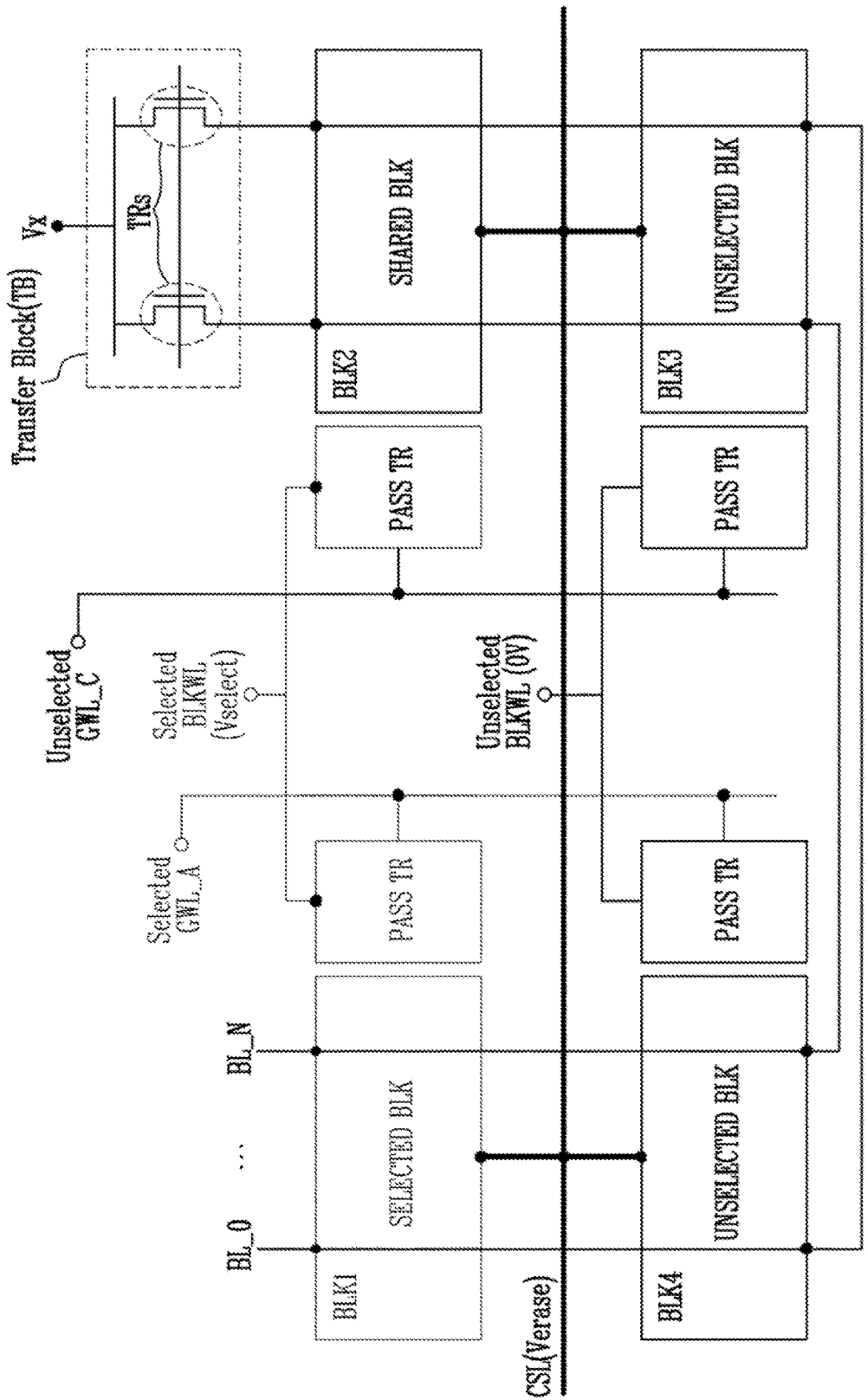
FIG. 14 is a diagram illustrating an erase method according to another embodiment.

FIG. 14 is a diagram illustrating an erase method according to another embodiment.

Referring to FIG. 14, the memory cell array of the semiconductor memory device according to an embodiment may further include the transfer block TB. The transfer block TB may include the plurality of switch transistors Tr coupled to the bit line.

First electrodes of switch transistors included in the transfer block TB may be coupled to bit lines, respectively, and second electrodes thereof may be coupled to precharge electrodes. In the embodiment shown in FIG. 14, the switches Tr included in the transfer block TB may not be coupled to the common source line CSL, contrary to the embodiment shown in FIG. 13, and an arbitrary precharge voltage Vx may be applied to the transfer block TB.

Therefore, during an erase operation of the semiconductor memory device, a constant precharge voltage Vx may be precharged in a direction toward the bit line regardless of an erase voltage applied to the common source line.

According to an embodiment, the first electrode may be a drain electrode and the second electrode may be a source electrode. However, the first electrode may be a source electrode and the second electrode may be a drain electrode.

The embodiments shown in FIGS. 12 to 14 may be applied to the erase operation of FIG. 7 as well as the erase operations of FIGS. 9 to 11.

Figure 15:
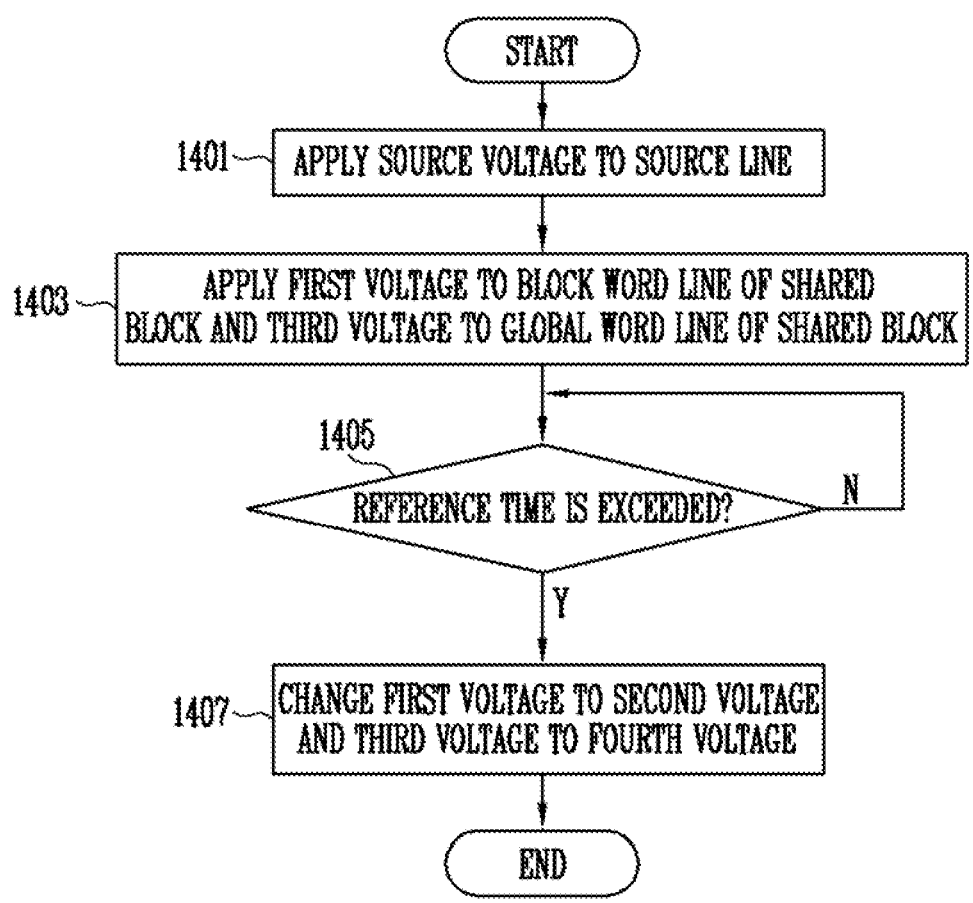
FIG. 15 is a flowchart illustrating operations of a semiconductor memory device according to an embodiment.

FIG. 15 is a flowchart illustrating operations of a semiconductor memory device according to an embodiment.

Referring to FIG. 15, at step 1401, the semiconductor memory device may apply an erase voltage to a source line.

At step 1403, the semiconductor memory device may apply a first voltage to a selected block word line SELECTED BLKWL of a shared block SHARED BLK and a third voltage to a global word line Global WL of the shared block SHARED BLK. The first voltage may be applied to turn on pass transistors PASS TRs of a selected block SELECTED BLK and the shared block SHARED BLK. According to an embodiment, the first voltage may have a higher voltage level than a voltage to turn on the pass voltages PASS TRs of the selected block SELECTED BLK and the shared block SHARED BLK by a predetermined voltage level. The third voltage may be applied to float local word lines of the shared block SHARED BLK to avoid an erase phenomenon of the shared block SHARED BLK. According to an embodiment, the third voltage may be applied to float the local word lines of the shared block in response to a voltage level of the first voltage.

At step 1405, the semiconductor memory device may determine whether a reference time is exceeded. When it is determined that the reference time is exceeded, the process flow proceeds to step 1407.

At step 1407, the semiconductor memory device may change the first voltage applied to the selected block word line SELECTED BLKWL of the shared block SHARED BLK to a second voltage and change the third voltage applied to the global word line Global WL applied to the shared block SHARED BLK to a fourth voltage. The second voltage may have a lower voltage level than the first voltage. The fourth voltage may have a lower voltage level than the third voltage. The fourth voltage may be applied to float the local word lines of the shared block SHARED BLK in response to the second voltage.

Figure 16:
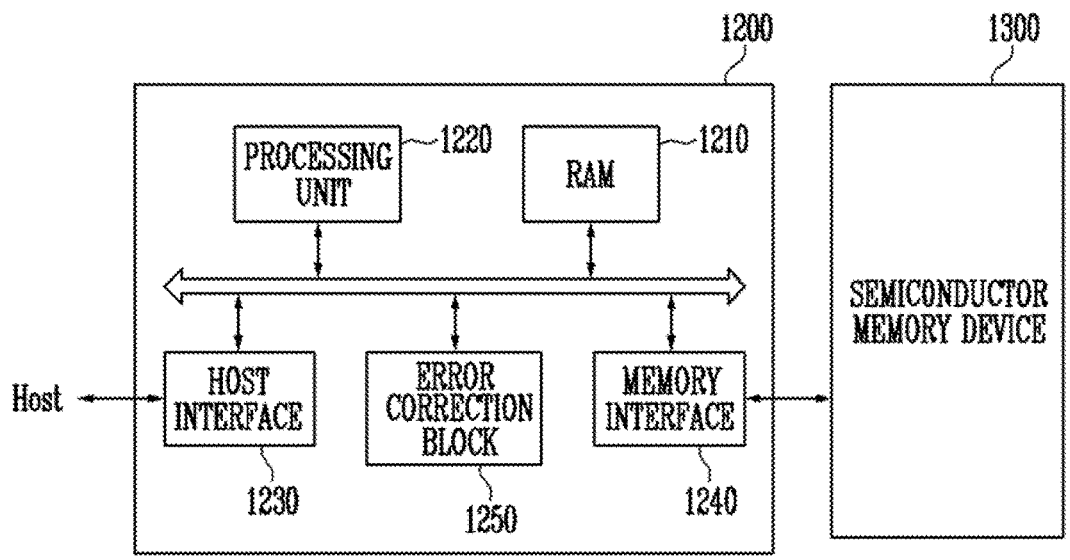
FIG. 16 is a block diagram illustrating an embodiment for realizing a controller shown in FIG. 1.

FIG. 16 is a block diagram illustrating one embodiment of the controller 50 shown in FIG. 1.

Referring to FIG. 16, the controller 1200 may include a Random Access Memory (RAM) 1210, a processing unit 1220, a host interface 1230, a memory interface 1240, and an error correction block 1250.

The processing unit 1220 may control the general operation of the controller 1200. The RAM 1210 may be used as at least one of an operation memory of the processing unit 1220, a cache memory between the semiconductor memory device and the host, and a buffer memory between the semiconductor memory device and the host.

The host interface 1230 may include a protocol for exchanging data between the host and the controller 1200. For example, the controller 1200 may communicate with the host through at least one of various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the semiconductor memory device 100.

The error correction block 1250 may detect and correct errors in data read from the semiconductor memory device 100 by using an error correction code (ECC).

The semiconductor device 1300 shown in FIG. 16 may be configured in the same manner as the memory device 1000 described with reference to FIG. 2.

Figure 17:
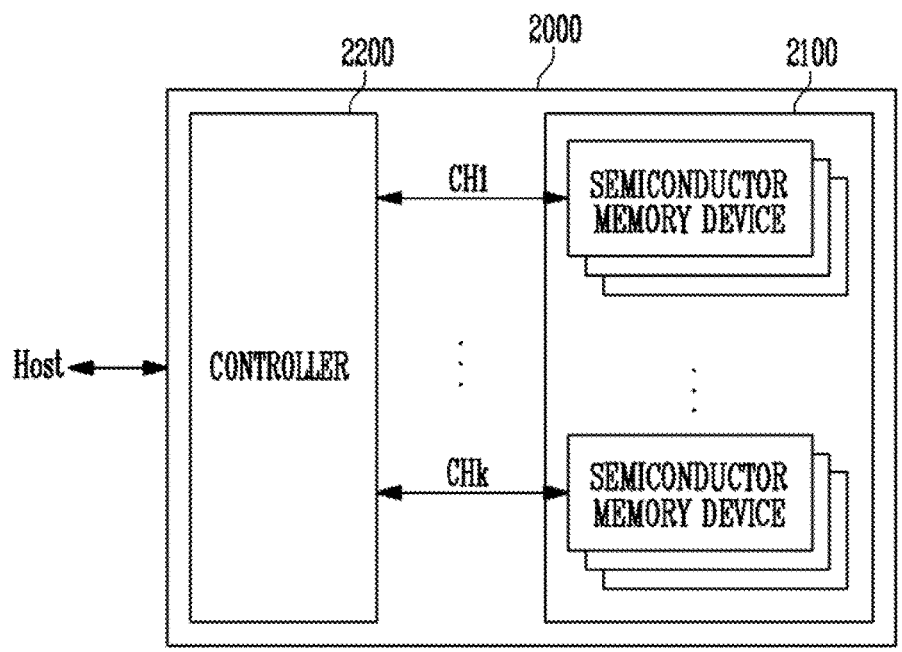
FIG. 17 is a block diagram illustrating an application example of a memory system including a controller shown in FIG. 16.

FIG. 17 is a block diagram illustrating an application example (2000) of the memory system including the controller 1200 shown in FIG. 16.

Referring to FIG. 17, a memory system 2000 may include a semiconductor memory device 2100 and a controller 2200. The semiconductor memory device 2100 may include a plurality of semiconductor memory chips. The semiconductor memory chips may be divided into groups.

The groups of the semiconductor memory chips may communicate with the controller 2200 through first to k-th channels CH1 to CHk. Each of the semiconductor memory chips may be configured and operated in substantially the same manner as the semiconductor memory device 100 described above with reference to FIG. 2.

Each group may communicate with the controller 2200 through a single common channel. The controller 2200 may be configured in substantially the same manner as the controller 1200 described with reference to FIG. 16, and configured to control the plurality of memory chips of the semiconductor memory device 2100. As illustrated in FIG. 17, a plurality of semiconductor memory chips may be coupled to a single channel. However, the memory system 2000 may be modified so that a single semiconductor memory chip may be coupled to a single channel.

The controller 2200 and the semiconductor memory device 2100 may be integrated into a single semiconductor device. According to an embodiment, the controller 2200 and the semiconductor memory device 2100 may be integrated into a single semiconductor device to form a memory card. For example, the controller 2200 and the semiconductor memory device 2100 may be integrated into a single semiconductor device to form a PC card (personal computer memory card international association (PCMCIA)), a compact flash (CF) card, a smart media card (SM or SMC), a memory stick, a multimedia card (MMC, RS-MMC or MMCmicro), an SD card (SD, miniSD, microSD or SDHC), or universal flash storage (UFS).

The controller 2200 and the semiconductor memory device 2100 may be integrated into a single semiconductor device to form a solid state drive (SSD). When the memory system 1000 is used as a semiconductor drive (SSD), an operating speed of the host coupled to the memory system 2000 may be significantly increased.

In another example, the memory system 2000 may be a computer, a UMPC (Ultra Mobile PC), a workstation, a net-book, a PDA (Personal Digital Assistant), a portable computer, a web tablet, a wireless phone, a mobile phone, a smart phone, an e-book, a PMP (Portable Multimedia Player), a portable game console, a navigation device, a black box, a digital camera, a 3-dimensional television, a digital audio recorder, a digital audio player, a digital picture recorder, a digital picture player, a digital video recorder, a digital video player, a device for wirelessly sending and receiving information, at least one of various electronic devices configuring a home network, at least one of various electronic devices configuring a computer network, at least one of various electronic devices configuring a telematics network and an RFID device.

According to an embodiment, the semiconductor memory device 2100 or the memory system 2000 may be mounted using various types of packages. For example, the semiconductor memory device 2100 or the memory system 2000 may be mounted using packages such as package on package (PoP), ball grid arrays (BGAs), chip scale packages (CSPs), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline integrated circuit (SOIC), shrink small outline package (SSOP), thin small outline package (TSOP), system in package (SIP), multi chip package (MCP), wafer-level fabricated package (WFP), wafer-level processed stack package (WSP), and the like.

Figure 18:
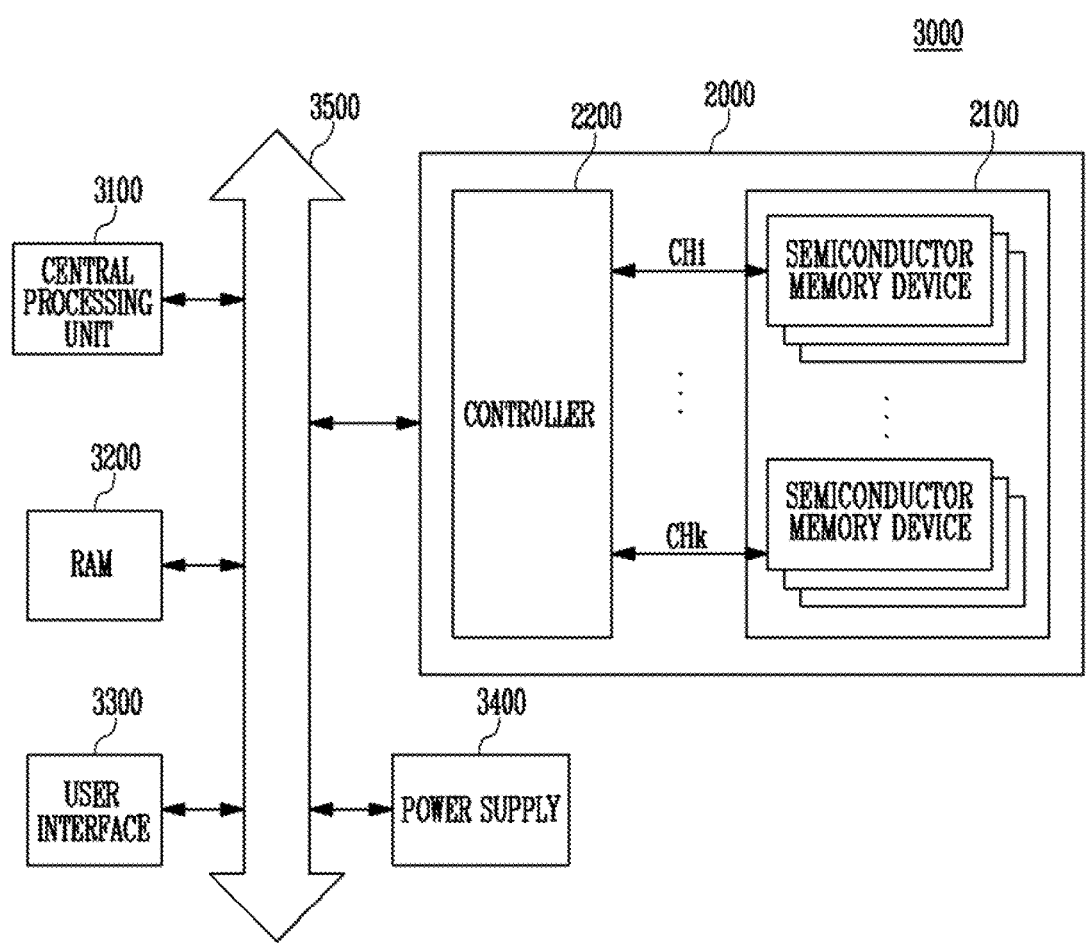
FIG. 18 is a block diagram illustrating a computing system including a memory system described with reference to FIG. 17.

FIG. 18 is a block diagram illustrating a computing system 3000 including the memory system 2000 described above with reference to FIG. 17.

Referring to FIG. 18, the computing system 3000 may include a central processing unit 3100, a Random Access Memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or data processed by the central processing unit 3100 may be stored in the memory system 2000.

FIG. 18 illustrates that the semiconductor memory device 2100 is coupled to the system bus 3500 through the controller 2200. However, the semiconductor memory device 2100 may be directly coupled to the system bus 3500. The functions of the controller 2200 may be performed by the central processing unit 3100 and the RAM 3200.

FIG. 18 illustrates that the memory system 2000 described above with reference to FIG. 17 is provided. However, the memory system 2000 may be replaced by the memory system described above with reference to FIG. 16. According to an embodiment, the computing system 3000 may include the memory system shown in FIG. 16 and the memory system 2000 shown in FIG. 17.

According to an embodiment, a semiconductor memory device having an increased erase speed and an operating method thereof may be provided.

It will be apparent to those skilled in the art that various modifications can be made to the above-described exemplary embodiments of the present invention without departing from the spirit or scope of the invention. Thus, it is intended that the present invention cover all such modifications provided the modifications are within the scope of the appended claims and their equivalents.

What is claimed is:

1. A method for operating a semiconductor memory device including at least two memory blocks sharing one block word line, the method comprising:
    applying an erase voltage to a source line commonly coupled to the memory blocks, one of which is a selected memory block; and
    applying a first voltage to the block word line and a third voltage to a global word line of an unselected memory block of the memory blocks when the erase voltage is applied to the source line,
    wherein the first voltage is higher than a turn-on voltage to turn on a pass transistor coupled to the block word line, and
    wherein the third voltage floats a local word line included in the unselected memory block according to a level of the first voltage.

2. The method of claim 1, further comprising applying a second voltage lower than the first voltage to the block word line and a fourth voltage to the global word line to float the local word line included in the unselected memory block according to the second voltage when a predetermined time passes.

3. The method of claim 2, wherein the second voltage has a level to turn on the pass transistor coupled to the block word line.

4. The method of claim 2, wherein the first voltage is higher than the second voltage by a predetermined voltage level.

5. The method of claim 2, wherein the fourth voltage is lower than the third voltage.

6. The method of claim 4, wherein the fourth voltage is lower than the third voltage by the predetermined voltage level.

7. The method of claim 1, further comprising applying the third voltage to a source selection line and a drain selection line of the unselected memory block while applying the third voltage the global word line of the unselected memory block.

8. A semiconductor memory device, comprising:
    at least two memory blocks sharing one block word line;
    a peripheral circuit suitable for performing an erase operation on a selected memory block of the memory blocks; and
    a control circuit suitable for controlling the peripheral circuit to apply a first voltage to the block word line and a third voltage to a global word line of an unselected memory block of the memory blocks when an erase voltage is applied to a source line commonly coupled to the memory blocks,
    wherein the first voltage is higher than a turn-on voltage to turn on a pass transistor coupled to the block word line, and
    wherein the third voltage floats a local word line included in the unselected memory block according to a level of the first voltage.

9. The semiconductor memory device of claim 8, wherein the control circuit further controls the peripheral circuit to apply a second voltage lower than the first voltage to the block word line and a fourth voltage to the global word line to float the local word line included in the unselected memory block according to the second voltage when a predetermined time passes.

10. The semiconductor memory device of claim 9, wherein the second voltage has a level to turn on the pass transistor coupled to the block word line.

11. The semiconductor memory device of claim 9, wherein the first voltage is higher than the second voltage by a predetermined voltage level.

12. The semiconductor memory device of claim 9, wherein the fourth voltage is lower than the third voltage.

13. The semiconductor memory device of claim 11, wherein the fourth voltage is lower than the third voltage by the predetermined voltage level.

14. The semiconductor memory device of claim 8, wherein the control circuit further controls the peripheral circuit to apply the third voltage to a source selection line and a drain selection line of the unselected memory block while applying the third voltage to the global word line of the unselected memory block.

15. A semiconductor memory device, comprising:
    an address decoder including a plurality of block decoders; and
    at least two memory blocks, one of which is a selected memory block, corresponding to one of the block decoders,
    wherein the address decoder applies a first voltage to a block word line, which is an output line of the block decoder, and a third voltage to a global word line of an unselected memory block of the memory blocks when an erase voltage is applied to a source line coupled commonly to the memory blocks,
    wherein the first voltage is higher than a turn-on voltage which turns on a pass transistor coupled to the block word line, and
    wherein the third voltage floats a local word line included in the unselected memory block according to a level of the first voltage.

16. The semiconductor memory device of claim 15, wherein the address decoder comprises:
   a block decoder unit suitable for outputting block selection signals in response to an address; and
   a pass unit suitable for respectively coupling global word lines to local word lines of the memory blocks.

17. The semiconductor memory device of claim 15, wherein the address decoder further applies a second voltage lower than the first voltage to the block word line and a fourth voltage to the global word line to float the local word line included in the unselected memory block according to the second voltage.

18. The semiconductor memory device of claim 17, wherein the second voltage has a level to turn on the pass transistor coupled to the block word line.

19. The semiconductor memory device of claim 17, wherein the first voltage is higher than the second voltage by a predetermined voltage level.

20. The semiconductor memory device of claim 19, wherein the fourth voltage is lower than the third voltage by the predetermined voltage level.

* * * * *